US012723947B2

(12) United States Patent
Yick et al.

(10) Patent No.: US 12,723,947 B2
(45) Date of Patent: Sep. 1, 2026

(54) METHOD AND APPARATUS FOR SILICON PHOTONICS TESTING

(71) Applicant: Marvell Asia Pte Ltd, Singapore (SG)

(72) Inventors: Andrew Yick, Porter Ranch, CA (US); Masaki Kato, Palo Alto, CA (US)

(73) Assignee: Marvell Asia Pte Ltd, Singapore (SG)

( * ) Notice: Subject to any disclaimer, the term of this patent is extended or adjusted under 35 U.S.C. 154(b) by 125 days.

(21) Appl. No.: 18/758,238

(22) Filed: Jun. 28, 2024

(65) Prior Publication Data

US 2025/0085193 A1 Mar. 13, 2025

Related U.S. Application Data

(60) Provisional application No. 63/537,379, filed on Sep. 8, 2023.

(51) Int. Cl.

| | |
|---|---|
| ***G01M 11/00*** | (2006.01) |
| ***G01M 11/02*** | (2006.01) |
| ***H10P 74/20*** | (2026.01) |
| *H10P 54/00* | (2026.01) |

(52) U.S. Cl.

CPC ........ *G01M 11/37* (2013.01); *G01M 11/0207* (2013.01); *H10P 74/203* (2026.01); *H10P 74/207* (2026.01); *H10P 54/00* (2026.01)

(58) Field of Classification Search

CPC ....... G01M 11/02; G01M 11/37; H01L 22/12; H01L 22/34; H01L 2221/68327

See application file for complete search history.

(56) References Cited

U.S. PATENT DOCUMENTS

| | | | | |
|---|---|---|---|---|
| 9,612,457 | B2 | 4/2017 | Nagarajan et al. | |
| 10,133,004 | B2 | 11/2018 | Kato | |
| 10,145,758 | B2 | 12/2018 | Traverso et al. | |
| 10,935,723 | B2 | 3/2021 | Karimelahi et al. | |
| 11,463,173 | B1 | 10/2022 | Zhang et al. | |
| 11,614,584 | B2 | 3/2023 | Venkatesan et al. | |
| 2018/0313718 | A1* | 11/2018 | Traverso | G02B 6/1228 |
| 2020/0033533 | A1* | 1/2020 | Khanna | G02B 6/30 |
| 2020/0124792 | A1 | 4/2020 | Cho et al. | |

OTHER PUBLICATIONS

Extended European Search Report for European Patent Application No. 24199251.0, mailed Feb. 4, 2025 (9 pages).

* cited by examiner

*Primary Examiner* — Maurice C Smith

(57) ABSTRACT

A first photonics integrated circuit (PIC) chip originates from a PIC wafer. The first PIC chip includes a substrate, and one or more optical communication components fabricated on the substrate. Optical testing components are also fabricated on the substrate. The optical testing components are configured to, prior to die singulation of the PIC wafer, transfer light to a second PIC chip on the PIC wafer for testing one or more operational attributes of optical components disposed on the second PIC chip Prior to die singulation of the PIC wafer, the second PIC chip was adjacent to the first PIC chip on the PIC wafer.

25 Claims, 14 Drawing Sheets

Testing components 108 for testing PIC Chip 104-2
Section of PIC Wafer 100
PIC Chip 104-1
Optical Couplers 160, 176
Electrical Pads 192
Electrical Pads 116
Electrical Pads 192
Distance D
PIC Chip 104-2
Electrical Pads 196
Electrical Pads 196
Testing components 188

PIC Chip
704-1

760-1 760-2 760-3
756 760-4
752-1 752-2
774-2
774-1
778
Testing
components
708 for testing
PIC Chip
704-2
782-1
782-2
782-3 782-4
772-1 776
790-1 790-2 790-3 790-4
786-1 786-2 786-3 786-4
788-1 788-2 788-3 788-4
780-1 780-2 780-3 780-4 784-1 784-2 784-3 784-4 772-2
724-1 724-2 724-3 724-4 720-1 720-2 720-3 720-4 728-2
TXIN RX1 RX2 RX3 RX4 TX1 TX2 TX3 TX4 736-2
728-1
716
736-1
732-2
740-2
740-1 732-1

PIC Chip
704-2

Prior Art

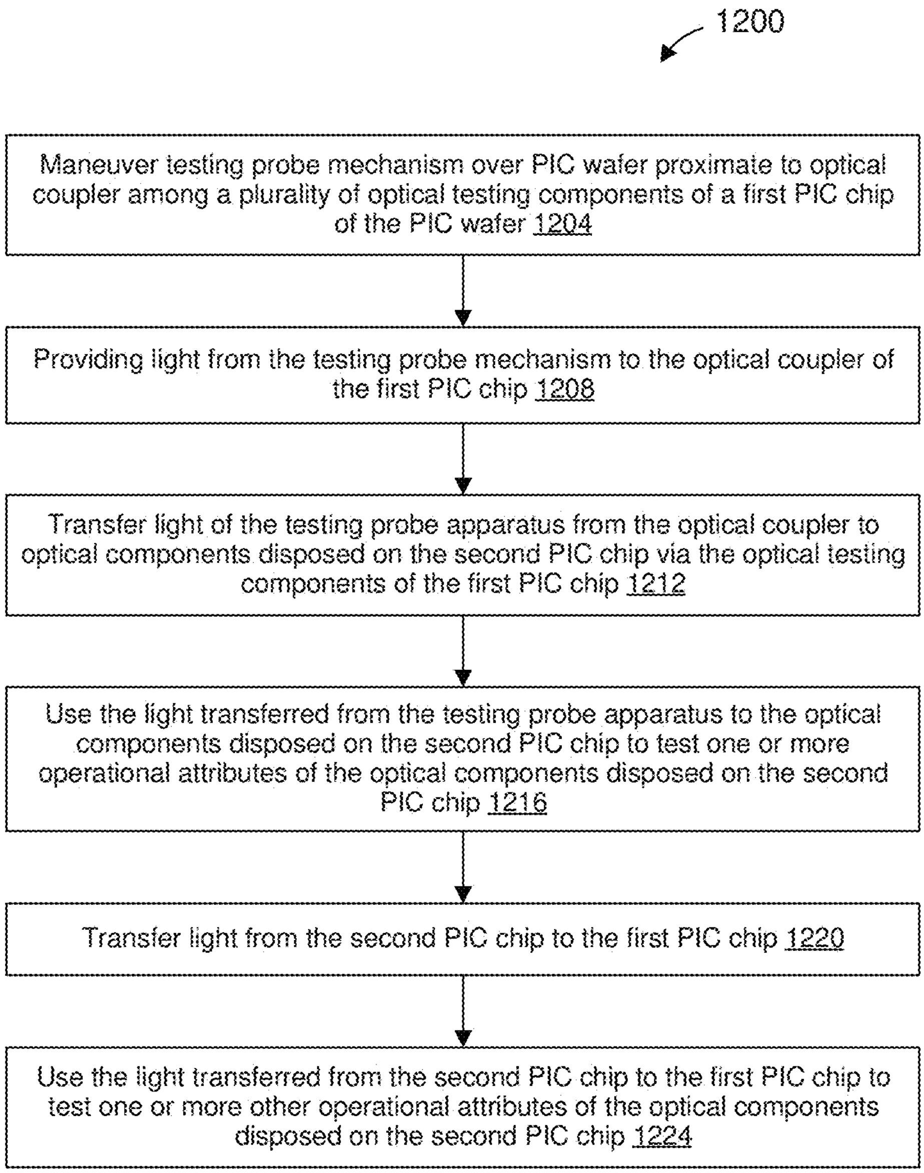

FIG. 12

Maneuver testing probe mechanism over PIC wafer proximate to optical coupler among a plurality of optical testing components of a first PIC chip of the PIC wafer 1204

Providing light from the testing probe mechanism to the optical coupler of the first PIC chip 1208

Transfer light of the testing probe apparatus from the optical coupler to optical components disposed on the second PIC chip via the optical testing components of the first PIC chip 1212

Use the light transferred from the testing probe apparatus to the optical components disposed on the second PIC chip to test one or more operational attributes of the optical components disposed on the second PIC chip 1216

Transfer light from the second PIC chip to the first PIC chip 1220

Use the light transferred from the second PIC chip to the first PIC chip to test one or more other operational attributes of the optical components disposed on the second PIC chip 1224

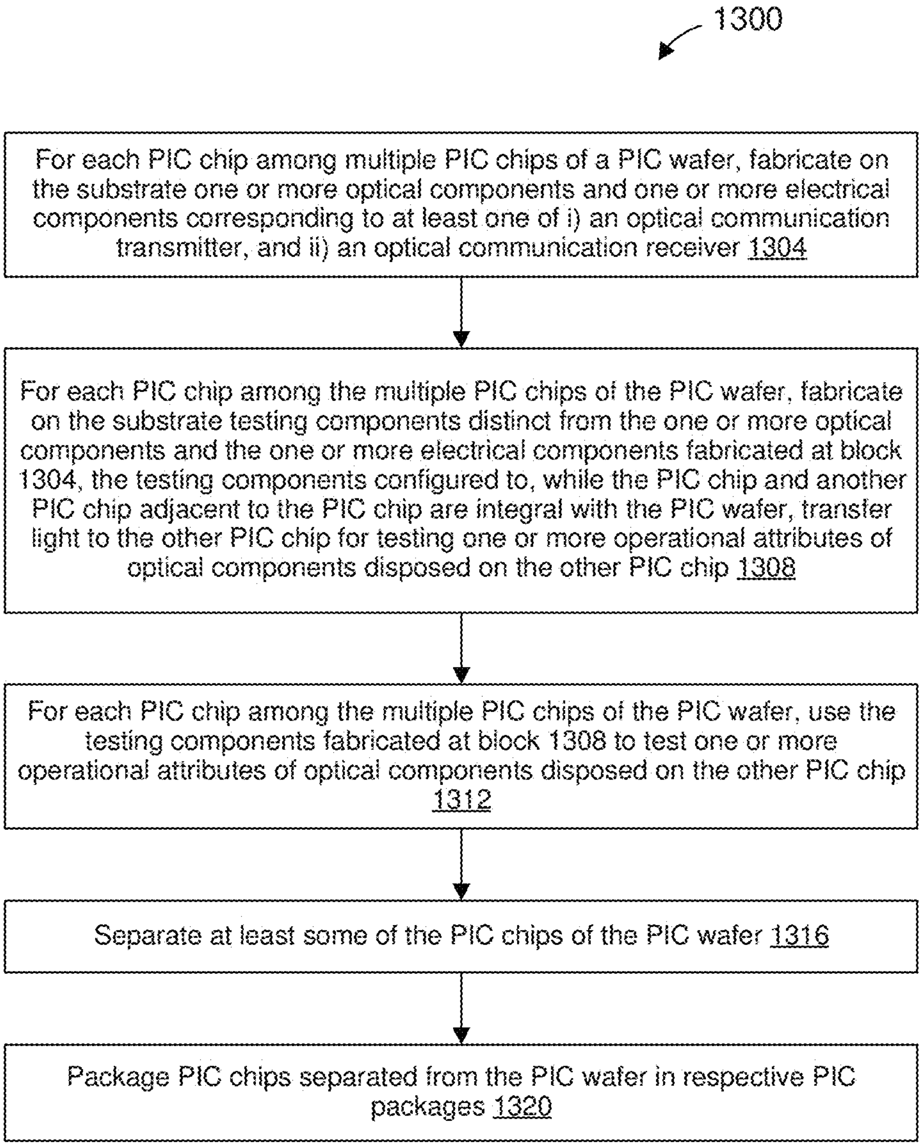

FIG. 13

For each PIC chip among multiple PIC chips of a PIC wafer, fabricate on the substrate one or more optical components and one or more electrical components corresponding to at least one of i) an optical communication transmitter, and ii) an optical communication receiver 1304

For each PIC chip among the multiple PIC chips of the PIC wafer, fabricate on the substrate testing components distinct from the one or more optical components and the one or more electrical components fabricated at block 1304, the testing components configured to, while the PIC chip and another PIC chip adjacent to the PIC chip are integral with the PIC wafer, transfer light to the other PIC chip for testing one or more operational attributes of optical components disposed on the other PIC chip 1308

For each PIC chip among the multiple PIC chips of the PIC wafer, use the testing components fabricated at block 1308 to test one or more operational attributes of optical components disposed on the other PIC chip 1312

Separate at least some of the PIC chips of the PIC wafer 1316

Package PIC chips separated from the PIC wafer in respective PIC packages 1320

METHOD AND APPARATUS FOR SILICON PHOTONICS TESTING

CROSS REFERENCES TO RELATED APPLICATIONS

This application claims the benefit of U.S. Provisional Patent App. No. 63/537,379, entitled "High-Throughput Vertically-Coupled Wafer-Level Silicon Photonics Test Methodology," filed on Sep. 8, 2023, the disclosure of which is expressly incorporated herein by reference in its entirety.

FIELD OF TECHNOLOGY

The present disclosure relates generally to silicon (Si) photonic integrated circuits (PICs), and more particularly to testing Si PICs.

BACKGROUND

Testing of silicon (Si) Photonic Integrated Circuits (PICs) at the wafer level is useful for screening for bad dies prior to subsequent assembly steps. Failure to screen out bad Si PICs prior to the subsequent assembly steps results in lowered overall yields, higher costs, and reduced assembly capacity because electrical/optical defects are detected later in the manufacturing chain.

A challenging aspect of Si PIC testing is coupling light on and off chip structures for parametric measurement. Generally, there are two primary methods for coupling light into and out of an Si PIC: a) vertical coupling via a grating coupler, and b) edge coupling via a mode converter. Edge coupling generally provides lower optical loss, greater relative polarization insensitivity, and better broadband wavelength response as compared to grating couplers, and thus edge coupling is frequently used to interface PIC dies with lasers, optical fibers, etc., in connection with later manufacturing stages. However, using edge coupling for wafer-level testing is impractical because the edges of PIC dies are not accessible prior to wafer dicing.

Grating couplers on a die are a potential solution for coupling light on to and off the die for wafer-level testing. As an example, for a die that includes an edge coupler for inputting light to a waveguide during end use operation, a grating coupler can also be included on the die proximate to the edge coupler for the purpose of inputting light to the waveguide during wafer-level testing. However, in order to input light to dies via grating couplers, a testing probe must be aligned to the grating coupler on each die, which increases costs often prohibitively. As a result, optoelectrical wafer-level testing of Si PICs is often skipped altogether.

SUMMARY

In an embodiment, a first photonics integrated circuit (PIC) chip is described, the first PIC chip having originated from a PIC wafer. The first PIC chip comprises: a substrate; one or more optical communication components fabricated on the substrate; and optical testing components fabricated on the substrate, the optical testing components configured to, prior to die singulation of the PIC wafer, transfer light to a second PIC chip on the PIC wafer for testing one or more operational attributes of optical components disposed on the second PIC chip, wherein the second PIC chip was adjacent to the first PIC chip on the PIC wafer prior to die singulation of the PIC wafer.

In another embodiment, a method for manufacturing PIC chips includes: fabricating a plurality of PIC chips on a PIC wafer having a substrate, including, for each PIC chip among multiple PIC chips of the PIC wafer: fabricating on the substrate one or more optical components and one or more electrical components corresponding to at least one of i) an optical communication transmitter, and ii) an optical communication receiver, and fabricating on the substrate testing components distinct from the one or more optical components and the one or more electrical components corresponding to the at least one of i) the optical communication transmitter, and ii) the optical communication receiver, the testing components configured to, while the PIC chip and another PIC chip adjacent to the PIC chip are integral with the PIC wafer, transfer light to the other PIC chip for testing one or more operational attributes of optical components disposed on the other PIC chip.

In yet another embodiment, a method for testing PIC chips integral with a PIC wafer includes: maneuvering a testing probe apparatus over the PIC wafer proximate to at least a first optical coupler among a plurality of optical testing components of a first PIC chip of the PIC wafer, the first PIC chip also comprising one or more optical communication components separate from the plurality of optical testing components; providing light from the testing probe apparatus to the at least the first optical coupler of the first PIC chip; transferring light of the testing probe apparatus from the at least the first optical coupler to optical components disposed on the second PIC chip via the optical testing components of the first PIC chip; and using the light transferred from the testing probe apparatus to the optical components disposed on the second PIC to test one or more operational attributes of the optical components disposed on the second PIC chip.

BRIEF DESCRIPTION OF THE DRAWINGS

FIG. 12 is a flow diagram of an example method for testing PIC chips integral with a PIC wafer, according to an embodiment.

FIG. 13 is a flow diagram of an example method for manufacturing PIC chips, according to an embodiment.

DETAILED DESCRIPTION

In embodiments described below, a photonic integrated circuit (PIC) wafer includes a first PIC chip and a second PIC chip that is adjacent to the first PIC chip. Each of the first PIC chip and the second PIC chip includes one or more optical communication components, such as one or more of (or none of) an optical modulator, an optical demodulator, an optical multiplexer, an optical demultiplexer, etc. The first PIC chip also includes one or more optical testing components that are configured to transfer light to the second PIC chip for testing optical components of the second PIC chip.

In some embodiments, the second PIC chip includes a first optical edge coupler, and the one or more optical testing components of the first PIC chip are configured to transfer light to the second PIC chip via the first optical edge coupler for testing at least the first optical edge coupler. In some embodiments, the second PIC chip additionally or alternatively includes a second optical edge coupler, and the one or more optical testing components of the first PIC chip are configured to receive light from the second PIC chip via the second optical edge coupler for testing at least the second optical edge coupler.

In some embodiments, the one or more optical testing components of the first PIC chip includes a first grating coupler configured to receive light from a testing probe mechanism, and the one or more optical testing components are configured to transfer the light received via the first grating coupler to the second PIC chip for testing optical components of the second PIC chip. In some embodiments, the one or more optical testing components of the first PIC chip additionally or alternatively includes a second grating coupler configured to transfer light to the testing probe mechanism, and the one or more optical testing components are configured to transfer light received from the second PIC chip to the second grating coupler for testing optical components of the second PIC chip.

Figure 1A:
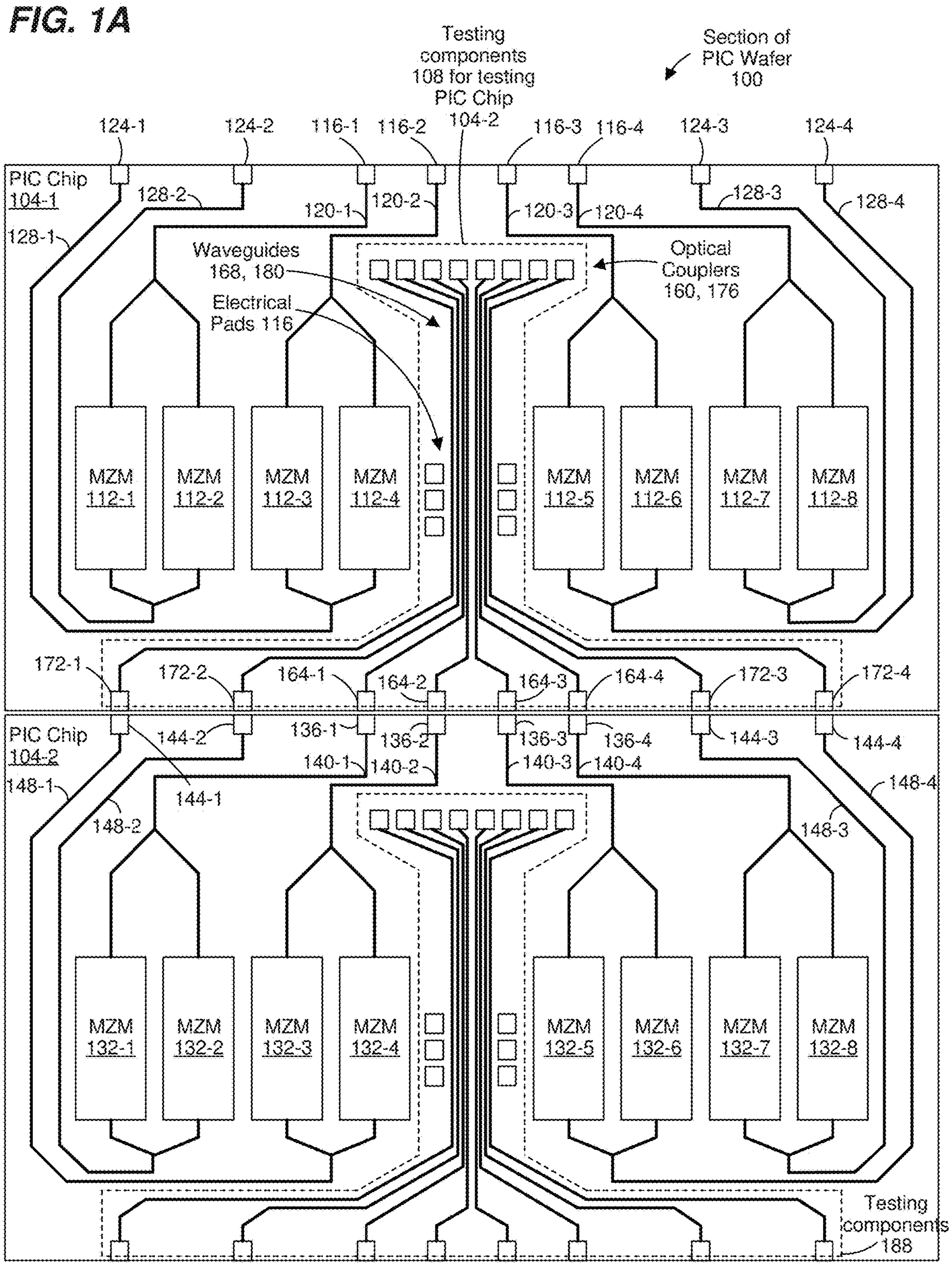
FIG. 1A is simplified diagram of a section of an example photonics integrated circuit (PIC) wafer in which a first PIC chip includes testing components for testing one or more operational attributes of optical components of a second PIC chip, according to an embodiment.
Figure 1B:
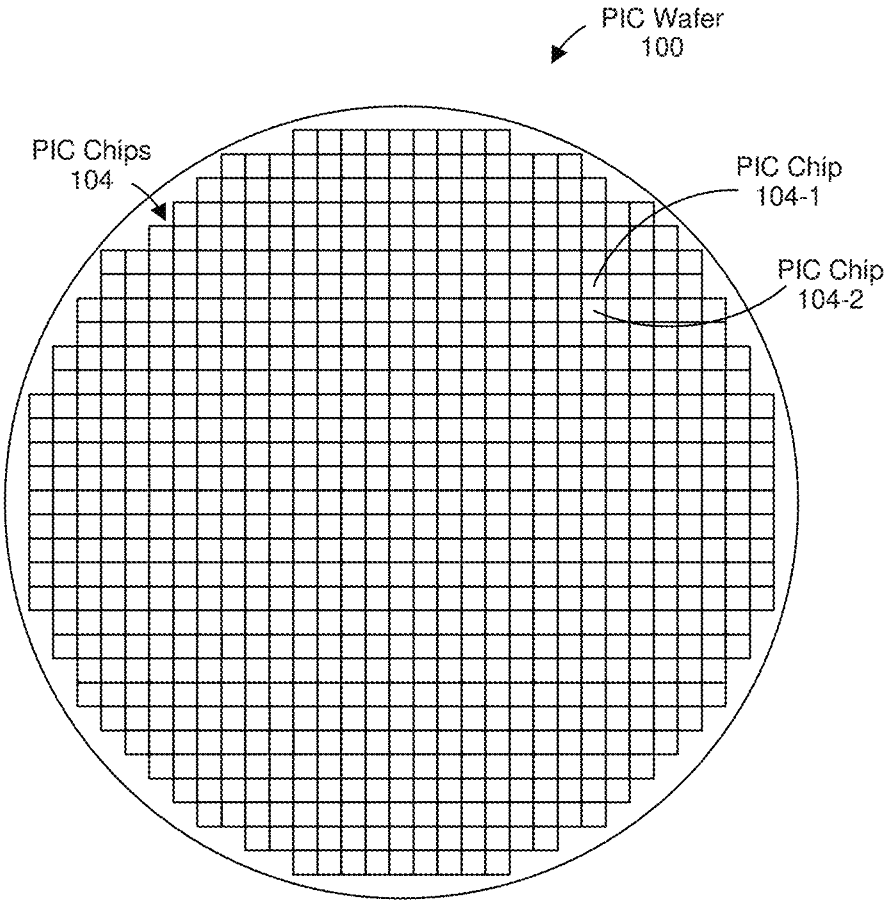
FIG. 1B is a simplified diagram of the PIC wafer for which a section is illustrated in FIG. 1A, according to an embodiment.

FIG. 1A is simplified diagram of a section of an example PIC wafer 100, according to an embodiment. The section of the PIC wafer 100 includes a PIC chip 104-1 and a PIC chip 104-2. For the purposes of clarity and conciseness, only a section of the PIC wafer is depicted in FIG. 1A. As seen in FIG. 1B, a simplified diagram of the PIC wafer 100, the PIC wafer 100 includes a plurality of PIC chips 104, including the PIC chip 104-1 and the PIC chip 104-2. In an embodiment, all of the PIC chips 104 have a same structure. For example, as seen in FIG. 1A, the chip 104-1 and the PIC chip 104-2 have the same structure. In other embodiments, most of the PIC chips 104 have the same structure, whereas one or more other PIC chips 104 have a different suitable structure.

Referring now to FIG. 1A, the PIC chip 104-1 includes a plurality of optical components and optionally electrical components, to be described below, corresponding to an end use of the PIC chip 104-1 that provides a desired functionality after the PIC chip 104-1 has been separated from other PIC chips 104 of the PIC wafer 100 and has been packaged in a suitable PIC package. For instance, in the example of FIG. 1A, the PIC chip 104-1 includes optical components and electrical components related to optical modulation for generating one or more optical communication signals for transmission via one or more suitable optical media. In another embodiment, the PIC chip 104-1 additionally or alternatively includes optical components and electrical components related to optical demodulation of one or more optical communication signals received via one or more suitable optical media. In other embodiments, the PIC chip 104-1 additionally or alternatively includes optical components and optionally electrical components related to processing one or more optical signals in another suitable other than optical modulation or optical demodulation, such as filtering one or more optical signals, optically multiplexing optical signals, optically demultiplexing optical signals, etc.

The PIC chip 104-1 also includes a plurality of optical components and optionally electrical components (i.e., testing components 108) that are configured to facilitate testing of one or more operational attributes of optical components disposed on a PIC chip 104 that is adjacent to the PIC chip 104-1, e.g., the PIC chip 104-2. As will be described further below, the testing components 108 provide one or more mechanisms for at least one of i) receiving light from a testing probe mechanism and transferring the light to the PIC chip 104-2, and ii) receiving light from the PIC chip 104-2 and transferring the light to the testing probe mechanism.

As explained above, each of at least some of the PIC chips 104 include testing components, like the testing components 108, 188 described above, for testing adjacent PIC chips 104. This is in contrast to other implementations in which testing components, like the testing components 108, 188 described above, are fabricated on sacrificial structures of the PIC wafer 100, which are discarded after testing and die singulation. When the testing components (like the testing components 108, 188) are included within the PIC chips 104, significantly less of the wafer 100 is wasted as compared to implementations in which testing components are fabricated on sacrificial structures of the PIC wafer 100.

Regarding the components of the PIC chip 104-1 apart from the testing components 108, the PIC chip 104-1 includes, in an embodiment, a plurality of Mach-Zehnder modulators (MZMs) 112 that are configured to modulate data onto a plurality of light signals for transmission. In another embodiment, the components of the PIC chip 104-1 apart from the testing components 108 include one or more other suitable optical modulators different than MZMs. The PIC chip 104-1 also includes a plurality of edge couplers 116 that are configured to receive light from one or more lasers when the PIC chip 104-1 is in an end use product form, e.g., after the PIC chip 104-1 has been separated from other PIC chips 104 of the PIC wafer 100 and has been packaged in a suitable PIC package. The edge couplers 116 are optically coupled to the MZMs 112 via a plurality of waveguides 120.

The PIC chip 104-1 also includes a plurality of edge couplers 124 that are configured to receive modulated light from the MZMs 112 and to output the modulated light, e.g., to an optical fiber in an end use configuration. The edge couplers 124 are optically coupled to the MZMs 112 via a plurality of waveguides 128.

As mentioned above, the PIC chip 104-2 has a same structure as the PIC chip 104-1. For example, the PIC chip 104-2 includes a plurality of MZMs 132 that correspond to the MZMs 112 of the PIC chip 104-1. Additionally, the PIC chip 104-2 includes edge couplers 136 that correspond to the edge couplers 116 of the PIC chip 104-1, and waveguides 140 that correspond to the waveguides 120 of the PIC chip 104-1. Additionally, the PIC chip 104-2 includes edge couplers 144 that correspond to the edge couplers 124 of the PIC chip 104-1, and waveguides 148 that correspond to the waveguides 128 of the PIC chip 104-1.

Referring to the testing components 108 of the PIC chip 104-1, the testing components 108 include optical couplers 160 that are configured to receive light from a testing probe mechanism. To facilitate testing of the PIC chip 104-2 while the PIC chip 104-1 and the PIC chip 104-2 are integral with the PIC wafer 100, the optical couplers 160 are configured to receive light from a direction that is at an angle between approximately 60-90 degrees with respect to a plane that is parallel to the PIC wafer 100, in an embodiment. In another embodiment, the optical couplers 160 are configured to receive light from a direction that is at an angle between approximately 70-90 degrees with respect to the plane that is parallel to the PIC wafer 100. In another embodiment, the optical couplers 160 are configured to receive light from a direction that is at an angle between approximately 75-90 degrees with respect to the plane that is parallel to the PIC wafer 100. In other embodiments, the optical couplers 160 are configured to receive light from a direction that is at another suitable angle with respect to the plane that is parallel to the PIC wafer 100.

In an embodiment, the optical couplers 160 comprise grating couplers. In another embodiment, the optical couplers 160 comprise other suitable couplers different than grating couplers.

The testing components 108 of the PIC chip 104-1 also include edge couplers 164 that are optically aligned with the edge couplers 136 of the PIC chip 104-2. The edge couplers 164 are optically coupled to the optical couplers 160 via waveguides 168. In a testing operation, light from a testing probe mechanism is received by the optical couplers 160 and transferred to the edge couplers 164 via the waveguides 168. The edge couplers 164 are configured to output the light from the testing probe mechanism to the edge couplers 136 of the PIC chip 104-2.

The testing components 108 of the PIC chip 104-1 also include edge couplers 172 that are optically aligned with the edge couplers 144 of the PIC chip 104-2. In a testing operation, light output by the edge couplers 144 of the PIC chip 104-2 is received by the optical couplers 172.

The testing components 108 further include optical couplers 176 that are configured to output light to the testing probe mechanism. Also to facilitate testing of the PIC chip 104-2 while the PIC chip 104-1 and the PIC chip 104-2 are integral with the PIC wafer 100, the optical couplers 176 are configured to output light in a direction that is at an angle between approximately 60-90 degrees with respect to a plane that is parallel to the PIC wafer 100, in an embodiment. In another embodiment, the optical couplers 176 are configured to output light in a direction that is at an angle between approximately 70-90 degrees with respect to the plane that is parallel to the PIC wafer 100. In another embodiment, the optical couplers 176 are configured to output light in a direction that is at an angle between approximately 75-90 degrees with respect to the plane that is parallel to the PIC wafer 100. In other embodiments, the optical couplers 176 are configured to output light in a direction that is at another suitable angle with respect to the plane that is parallel to the PIC wafer 100.

In an embodiment, the optical couplers 176 comprise grating couplers. In another embodiment, the optical couplers 176 comprise other suitable couplers different than grating couplers.

The edge couplers 172 are optically coupled to the optical couplers 176 via waveguides 180. In a testing operation, light output by the edge couplers 144 of the PIC chip 104-2 are received by the edge couplers 172. The light received by the edge couplers 172 is transferred to the optical couplers 176 via the waveguides 180. The optical couplers 176 are configured to output the light from the edge couplers 144 of the PIC chip 104-2 to the testing probe mechanism.

In an embodiment, the waveguides 168, 180 are routed on a lower silicon nitride layer under upper metal layers, which permit fabrication of electrical die pad frames without significant regard to optical structures of the testing components 108. In an embodiment, the waveguides 168, 180 are fabricated to keep a mode radius of the waveguides 168, 180 under the metal layers to be sufficiently smaller than a stack height difference between the silicon nitride layer and the metal.

The testing components 108 also include electrical and/or electro-optical components (not shown) such as photodiodes, sensors, signal buffers, etc., to facilitate testing of the PIC chip 104-2 while the PIC chip 104-1 and the PIC chip 104-2 are integral with the PIC wafer 100. The testing components 108 include electrical pads 116 that are electrically coupled to the electrical and/or electro-optical components via circuit traces (not shown). The electrical pads 116 are configured to electrically couple to electrical contacts (e.g., pins, etc.) of the testing probe mechanism to i) receive first electrical signals (e.g., power, ground, control signals, high speed data signals (test data) for modulation by optical modulators under test, etc.) from the testing probe mechanism, and ii) provide second electrical signals from the electrical and/or electro-optical components to the testing probe mechanism, such as outputs of photodiodes, high speed demodulated data signals output by optical demodulator circuitry under test, etc. Circuit traces of the testing components 108 transfer the first electrical signals from the electrical pads 116 to the electrical and/or electro-optical components, and transfer the second electrical signals from the electrical and/or electro-optical components to the electrical pads 116.

The PIC chip 104-2 includes testing components 188 that have the same structure as (or a structure similar to) the testing components of the testing components 108 of the PIC chip 104-1. The testing components 188 of the PIC chip 104-2 are configured to facilitate testing of one or more operational attributes of optical components disposed on another PIC chip 104 that is adjacent to the PIC chip 104-2 in a manner the same as or similar to the operation of the testing components 108 of the PIC chip 104-1 described above.

Edge couplers of a PIC chip, such as the edge couplers 136, 144 of the PIC chip 104-2, are often laterally spaced at different distances and/or laterally spaced at distances that are significantly longer than pitches of optical inputs/outputs of typical testing probes. In an illustrative embodiment, the edge couplers 144-1 and 144-2 are laterally spaced at a distance of 1.6 millimeters (mm), and the edge couplers 144-3 and 144-4 are laterally spaced at 1.6 mm; the edge coupler 144-2 and the edge coupler 136-1 are laterally spaced at 1.5 mm, and the edge coupler 136-4 and the edge coupler 144-3 are laterally spaced at 1.5 mm; and the edge couplers 136 are laterally spaced at a distance of 500 micrometers (μm). On the other hand, a pitch of optical inputs/outputs of a typical optical testing probe is 127 μm or 250 μm.

The optical couplers 160, 176 of the testing components 108 are equally spaced at a suitable distance that corresponds to a pitch of optical inputs/outputs of a typical optical testing probe, as discussed above, according to an embodiment. For example, the optical couplers 160, 176 are equally spaced by 127 μm, or equally spaced by 250 μm, in some embodiments. Thus, the testing components 108 are configured to, in connection with testing the PIC chip 104-2, convert a lateral spacing of optical input/outputs of the PIC chip 104-2 from a first lateral spacing to a second lateral spacing that is uniform and shorter than the first spacing, according to some embodiments. The second spacing corresponds to a pitch of optical inputs/outputs of a typical optical testing probe, according to an embodiment. Converting a lateral spacing of optical input/outputs of the PIC chip 104-2 from the first lateral spacing to a standard fiber array optical pitch, reduces a testing probe cost and/or complexity, and removes the need for a custom optical block for the testing probe (which might be cost prohibitive and/or commercially infeasible), at least in some embodiments.

In some embodiments, the PIC chip 104-1 includes electrical and/or electro-optical components (not shown), distinct from the testing components 108, that are configured to provides a desired functionality according to an end use of the PIC chip 104-1 after the PIC chip 104-1 has been separated from other PIC chips 104 of the PIC wafer 100 and has been packaged in a suitable PIC package. For example, the MZMs 112 include electrodes that receive modulation control signals, where the modulation control signals provided to the electrodes cause the MZMs 112 to modulate light input to the MZMs 112, according to an embodiment. As another example, the MZMs 112 include electrodes that receive power, ground, and/or bias signals for electrically configuring the MZMs 112 for operation, according to an embodiment. The electrical and/or electro-optical components are electrically coupled to circuit traces (not shown) that are configured to deliver electrical signals to or from the electrical and/or electro-optical components.

Figure 1C:
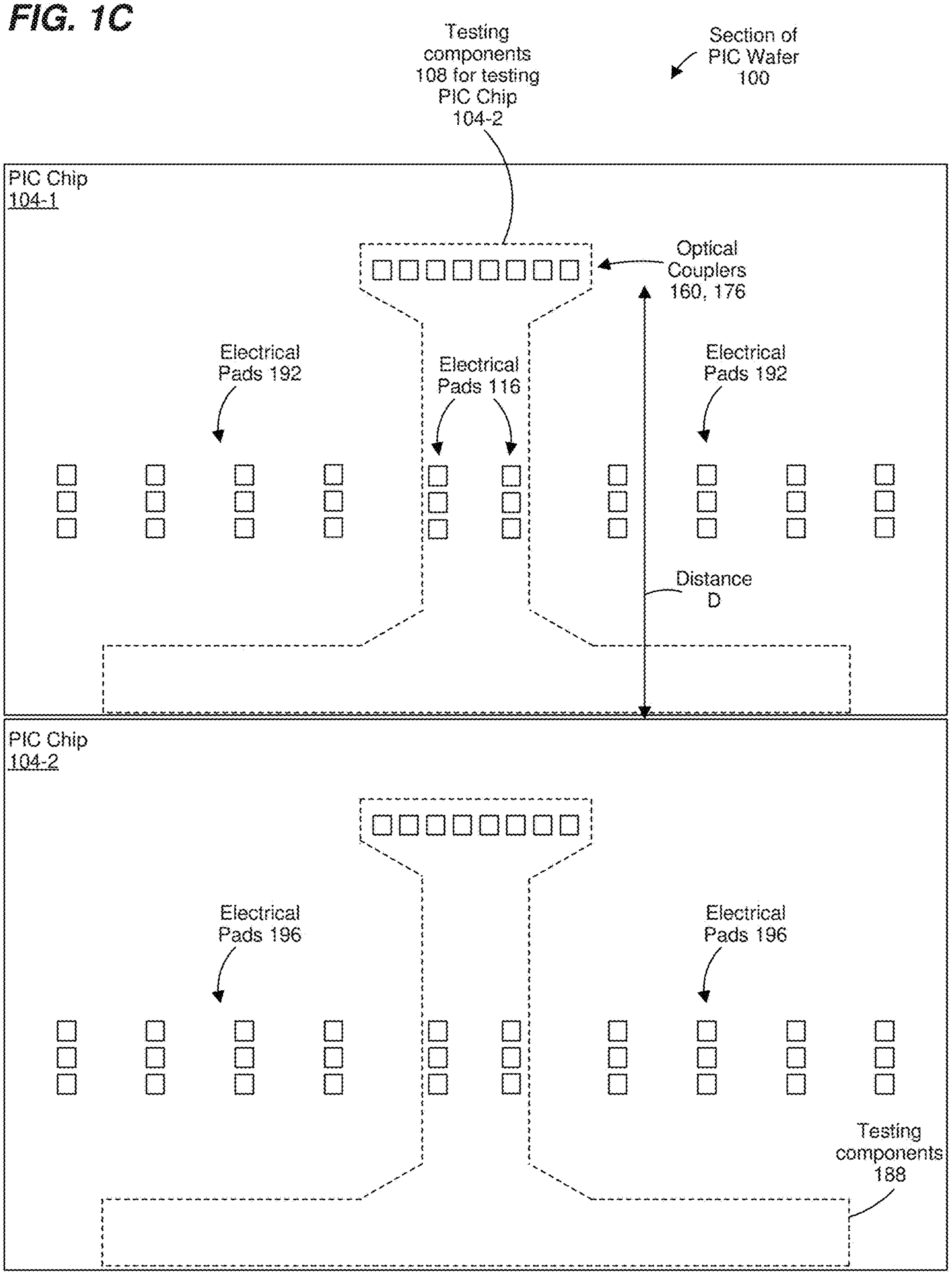
FIG. 1C is a simplified diagram that illustrates a surface of the section of the wafer of FIG. 1A, according to an embodiment.

Referring now to FIG. 1C, which illustrates a surface of the section of the wafer 100 of FIG. 1A, the PIC chip 104-1 includes electrical pads 192, distinct from the testing components 108, that are electrically coupled to the electrical and/or electro-optical components via the circuit traces discussed above. In some embodiments, such electrical pads 192 provide mechanisms for sending electrical signals to and/or receiving electrical signals from the electrical and/or electro-optical components.

As discussed above, the PIC chip 104-2 has a same structure as the PIC chip 104-1, and thus the PIC chip 104-2 includes electrical and/or electro-optical components and the circuit traces (not shown in FIG. 1A) that are configured to provides a desired functionality according to an end use of the PIC chip 104-2 after the PIC chip 104-2 has been separated from other PIC chips 104 of the PIC wafer 100 and has been packaged in a suitable PIC package. Additionally, the PIC chip 104-2 includes the electrical pads 196, distinct from the testing components 188, that are electrically coupled to the electrical and/or electro-optical components via the circuit traces discussed above. In some embodiments, the electrical pads 196 are used to provide, during a testing procedure for testing the PIC chip 104-2, third electrical signals (e.g., power, ground, bias signals, modulation control signals, high speed data signals (test data) for modulation by optical modulators under test, etc.) to the PIC chip 104-2, and/or to receive, during the testing procedure for testing the PIC chip 104-2, fourth electrical signals from the PIC chip 104-2 (e.g., outputs of photodiodes, high speed demodulated data signals output by optical demodulator circuitry under test, etc.).

In an embodiment, the electrical pads 196 of the PIC chip 104-2 are configured to electrically couple to electrical contacts (e.g., pins, etc.) of the testing probe mechanism to i) receive the third electrical signals (e.g., power, ground, bias, modulation control signals, high speed data signals (test data) for modulation by optical modulators under test, etc.) from the testing probe mechanism, and ii) provide the fourth electrical signals (e.g., outputs of photodiodes, high speed demodulated data signals output by optical demodulator circuitry under test, etc.) from the electrical and/or electro-optical components to the testing probe mechanism. Circuit traces of the PIC chip 104-2 transfer the third electrical signals from the electrical pads 196 to the electrical and/or electro-optical components, and transfer the fourth electrical signals from the electrical and/or electro-optical components to the electrical pads 196.

As illustrated in FIG. 1C, the optical couplers 160, 176 are laterally spaced from the PIC chip 104-2 by a distance D, and this lateral spacing between the optical couplers 160, 176 and the PIC chip 104-2 provides clearance for testing probe components that are to make contact with the electrical pads 196 of the PIC chip 104-2. In some embodiments, this lateral spacing permits a simplification of the testing probe design as compared to an implementation in which the optical couplers 160, 176 were located significantly closer to the PIC chip 104-2.

In a testing operation in which the PIC chip 104-2 is being tested, a testing probe mechanism is maneuvered over the wafer 100 proximate to the PIC chip 104-1 and the PIC chip 104-2 such that i) a lensed fiber array of the testing probe mechanism is aligned with the optical couplers 160, 176 of the PIC chip 104-1, and ii) electrical contacts (e.g., pins, etc.) of the testing probe mechanism are aligned with and make contact with the electrical pads 196 of the PIC chip 104-2. Optionally, other electrical contacts (e.g., pins, etc.)

of the testing probe mechanism are aligned with and make contact with the electrical pads 116 of the PIC chip 104-1.

The testing probe mechanism provides electrical signals (e.g., one or more of a ground signal, a power signal, a control signal, a biasing signal, modulation control signals, high speed data signals (test data) for modulation by optical modulators under test, etc.) to the electrical pads 196 and optionally the electrical pads 116. Additionally, the testing probe mechanism provides one or more light signals to the optical couplers 160. The waveguides 168 and the edge couplers 164 provide the light signals from the testing probe mechanism to the edge couplers 136 of the PIC chip 104-2. In this way, one or more operational attributes of the edge couplers 136 of the PIC chip 104-2 can be tested while the PIC chip 104-2 is still integral with the PIC wafer 100, which is not possible with typical PIC wafer testing techniques.

Light signals from the MZMs 132 of the PIC chip 104-2 (FIG. 1A) are output by the edge couplers 144 of the PIC chip 104-2 and received by the edge couplers 172 of the PIC chip 104-1. The light signals received by the edge couplers 172 are transferred to the optical couplers 176 via the waveguides 180, and the optical couplers 176 output the light signals to the testing probe mechanism. In this way, one or more operational attributes of the edge couplers 144 of the PIC chip 104-2 can also be tested while the PIC chip 104-2 is still integral with the PIC wafer 100, which is not possible with typical PIC wafer testing techniques. Additionally, as light is transferred from the testing probe mechanism to the MZMs 132 and light signals from the MZMs 132 are transferred to the to the testing probe mechanism, one or more operational attributes of the MZMs 132 can be tested while the PIC chip 104-2 is still integral with the PIC wafer 100.

In some embodiments, electrical signals output by the PIC chip 104-2 (e.g., outputs of photodiodes, high speed demodulated data signals output by optical demodulator circuitry, etc.) are received testing probe mechanism and are analyzed by a testing apparatus.

The structure of the PIC chips 104 described above are merely simplified examples. In other embodiments, the PIC chips 104 have another suitable structure.

Figure 2A:
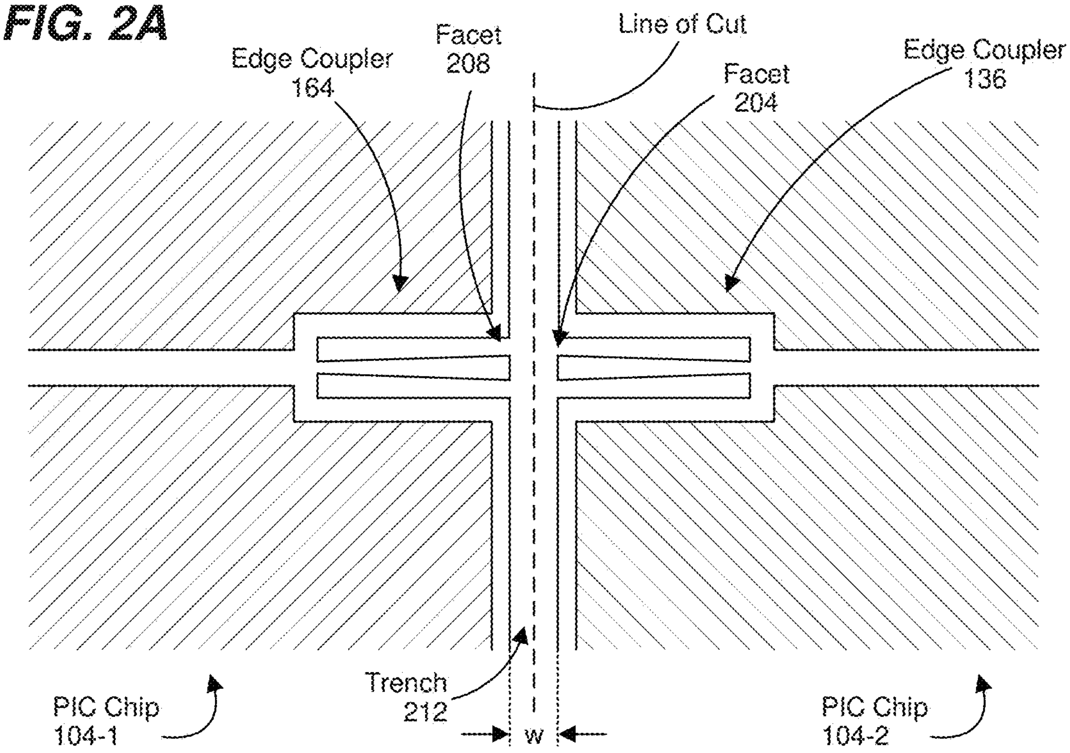
FIG. 2A is an enlarged view of the PIC wafer of FIG. 1A showing a first edge coupler of a first PIC chip and a corresponding second edge coupler of a second PIC chip, according to an embodiment.

FIG. 2A is an enlarged view of a portion of the PIC wafer 100 of FIG. 1A showing one of the edge couplers 136 of the PIC chip 104-2 and a corresponding edge coupler 164 of the PIC chip 104-1, according to an embodiment. The edge couplers 144, 172 (FIG. 1A) have a suitable structure to the edge coupler structures illustrated in FIG. 2A, in some embodiments. Although FIG. 2A illustrates an example structure of the edge coupler 136 and the edge coupler 164 (e.g., a fork structure), the PIC chips 104 include edge couplers (e.g., the edge couplers 136, 144, 164, 172) with other suitable edge coupler structures, according to other embodiments.

The edge coupler 136 includes a facet 204, and the edge coupler 164 includes a facet 208. The facets 204, 208 are aligned, by design, via photolithography to sub-micron accuracy, for example, during silicon PIC foundry fabrication. An air gap trench 212 is formed between the PIC chip 104-1 and the PIC chip 104-2 using a suitable PIC fabrication process, such as reactive ion etching (RIE), or another suitable process. In an embodiment, the process used to form the air gap trench 212 also acts form smooth facets 204, 208.

The trench 212 has a suitable width w. The width w is selected to be significantly within a Rayleigh range of an expanding mode to minimize coupling loss. On the other hand, the width w is selected to be sufficiently large enough to allow for economical separation of the PIC chips 104 during die singulation through a suitable dicing technique, such as laser dicing, blade dicing, etc. When the width w is sufficiently narrow, an optical loss between the edge couplers 136, 164 will be sufficiently low to fit a typical optical link budget.

Figure 2B:
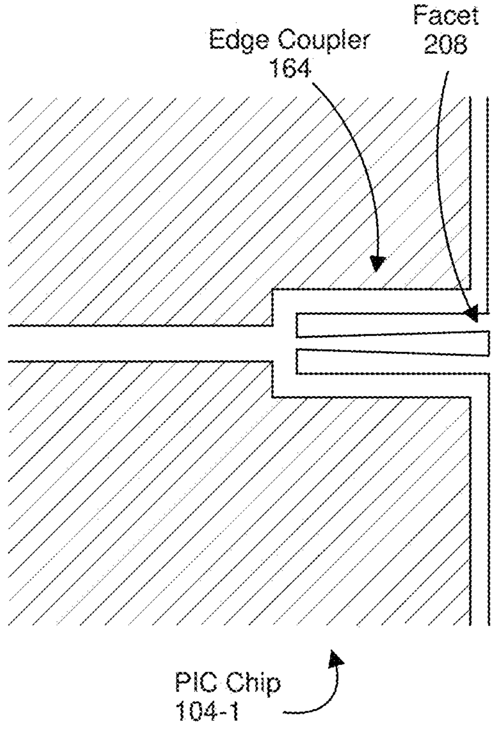
FIG. 2B is a view of the first PIC chip of FIG. 2A after separation from the second PIC chip of FIG. 2A, according to an embodiment.

FIG. 2B is an illustration of the PIC chip 104-1 of FIG. 2A after separation from the PIC chip 104-2, according to an embodiment.

Although FIGS. 2A-B were described with reference to FIG. 1A, the techniques described with reference to FIGS. 2A-B are utilized with other suitable PIC chips different than the example PIC chips 104 of FIG. 1A, in some embodiments. In some embodiments, the techniques described with reference to FIGS. 2A-B are not utilized with the example PIC chips 104 of FIG. 1A.

Figure 3:
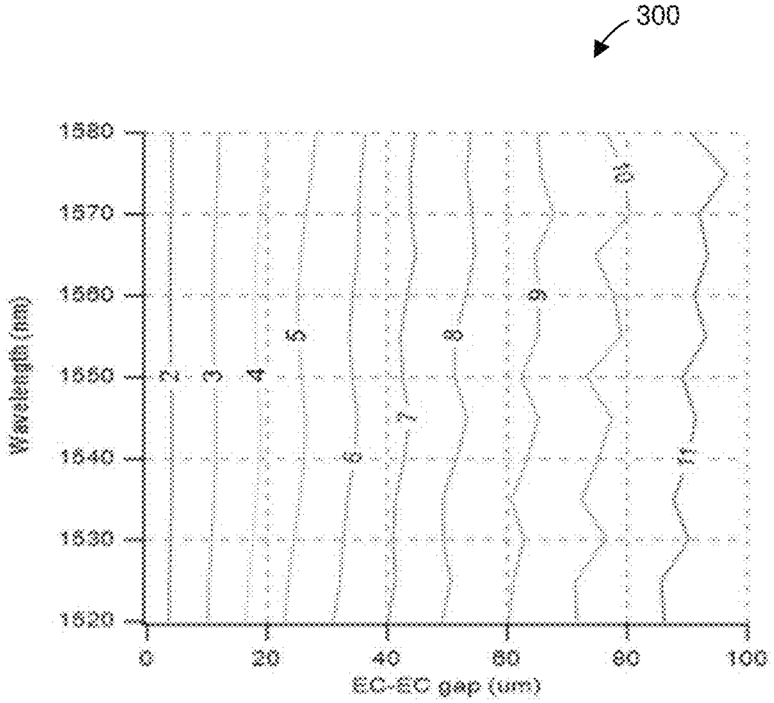
FIG. 3 is a graph of a simulation of optical coupling loss between edge couplers of adjacent PIC chips, such as illustrated in FIG. 2A, versus trench width, according to an embodiment.

FIG. 3 is a graph 300 of a simulation of optical coupling loss between edge couplers of adjacent PIC chips (such as the PIC chip 104-1 and the PIC chip 104-2) versus trench width, according to an embodiment. An optical loss corresponding to a 40 μm trench width using blade dicing is approximately 6-7 decibels (dB), which was verified in measurements using PIC chips fabricated using a 1550 nm process. An optical loss corresponding to a 20 μm trench width using laser dicing is approximately 4-5 dB, which is significantly better than an alternative testing technique in which light is into a PIC chip under test using a 2×2 input directional optical coupler. Such an input directional optical coupler typically has a relatively high optical loss due to low coupler/tap ratios for the input laser in the optical path—typically 20:80—which results in at least a 7 dB optical loss. If such an input directional optical coupler employs an unused port of a 90:10 tap, the optical loss can be greater than 10 dB, which may require use of a fiber amplifier and potentially dangerous optical power levels in the test setup. Thus, the use of techniques such as described herein eliminates a need for fiber amplifiers and potentially dangerous optical power levels in a test setup, at least in some embodiments.

Figure 4:
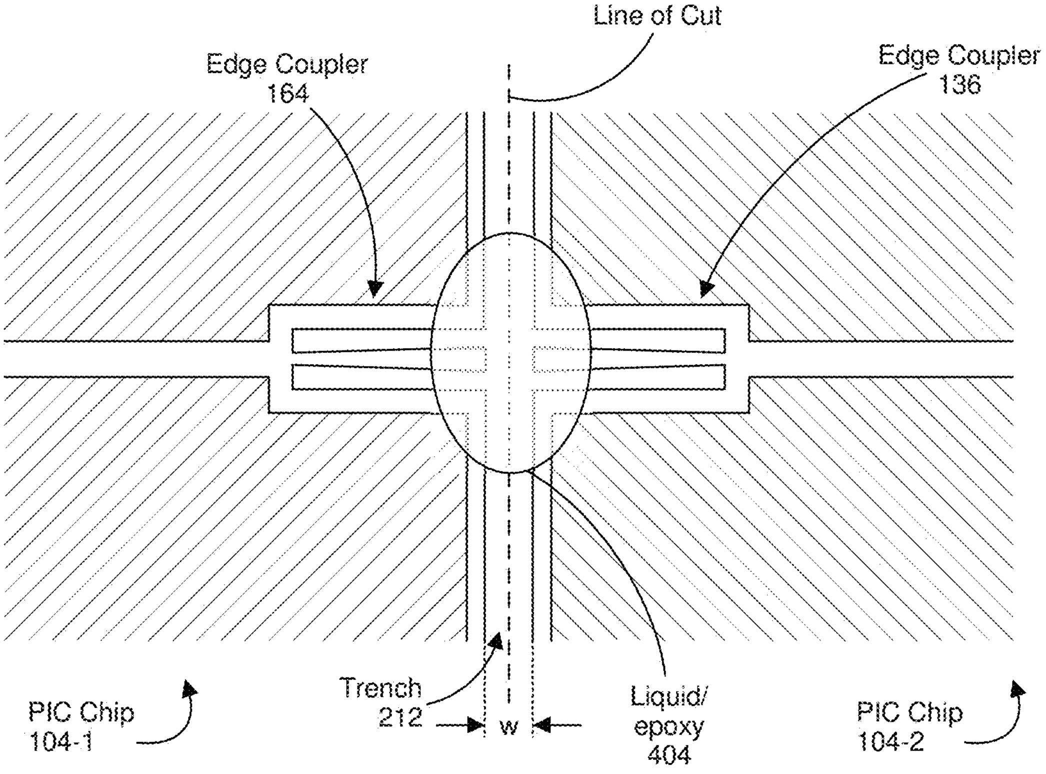
FIG. 4 is an illustration of the edge couplers of FIG. 2A with an optically transparent liquid or epoxy deposited between the edge couplers, according to another embodiment.

FIG. 4 is an illustration of the PIC chip 104-1 and the PIC chip 104-2 of FIG. 2A, according to another embodiment. An optically transparent liquid or epoxy 404 is deposited in the trench 212 between the edge coupler 136 and the edge coupler 164 at least for purposes of testing as described above. The use of the liquid/epoxy 404 during testing facilitates obtaining measurements while the PIC chip 104-2 is still integral with the PIC wafer 100 that are more closely matched to a final end-use coupling, at least in some embodiments. For example, a refraction index of the liquid/epoxy 404 is selected to match a refractive index of waveguides of the PIC chips 104, which reduces divergence and mitigates reflections which would be seen with an air gap in the trench 212 that omits the liquid/epoxy 404, according to some embodiments.

The liquid/epoxy 404 is later heated to evaporate, e.g., using an isopropyl alcohol (IPA) vapor vacuum dryer or another suitable mechanism, or removed in a wash step, e.g., in connection with dicing, according to some embodiments. In another embodiment, an epoxy 404 that is used in manufacturing assembly of the PIC chips 104 is cured in place.

In some embodiments, the use of the liquid/epoxy described above with reference to FIG. 4 is utilized with other suitable PIC chips different than the example PIC chips 104 of FIG. 1A, in some embodiments. In some embodiments, the use of the liquid/epoxy described above with reference to FIG. 4 is not utilized with the example PIC chips 104 of FIG. 1A.

Figure 5:
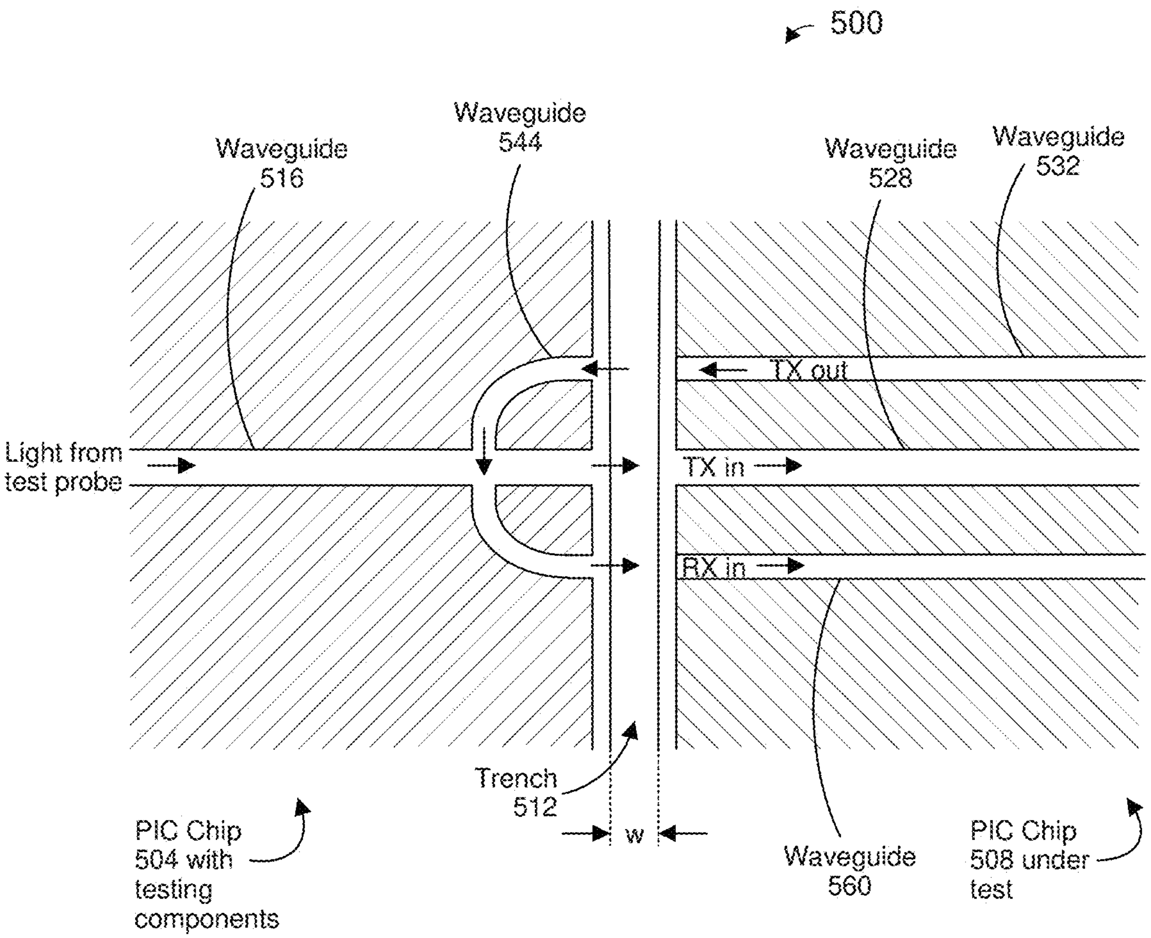
FIG. 5 is an enlarged view of an example PIC wafer illustrating testing components of a PIC chip that feedback light output from an optical transmitter component of another PIC chip, according to an embodiment.

In some embodiments in which each of at least some of the PIC chips include optical communication transmitter components and optical communication receiver components, the testing components of a first PIC chip include one or more waveguides that feedback light output from an optical transmitter component of an adjacent second PIC chip to an optical receiver component of the second PIC chip. FIG. 5 is an enlarged view of an example PIC wafer 500 illustrating testing components of a PIC chip 504 that feedback light output from an optical transmitter component of a PIC chip 508, according to an embodiment.

A trench 512 such as described above is fabricated between the PIC chip 504 and the PIC chip 508.

Testing components of the PIC chip 504 include a waveguide 516. The waveguide 516 transfers light received from a testing probe to a first edge coupler (not shown) of the PIC chip 504. A waveguide 528 of the PIC chip 508 transfers light from the testing probe (received via a second edge coupler (not shown) of the PIC chip 508) toward an optical transmitter component (not shown) of the PIC chip 508. The optical transmitter component of the PIC chip 508 generates an output optical signal, which is transferred to a third edge coupler (not shown) of the PIC chip 508 via a waveguide 532. A waveguide 544 of the testing components of the PIC chip 504 receives the output optical signal from the PIC chip 508 via a fourth edge coupler (not shown) of the PIC chip 504. The waveguide 544 feeds back the output optical signal from the PIC chip 508 back to the PIC chip 508 via a fifth edge coupler (not shown) of the PIC chip 504. The waveguide 544 intersects the waveguide 516 with a high-isolation 90° waveguide crossing perpendicular to the waveguide 516.

A waveguide 560 of the PIC chip 508 transfers light from the testing components of the PIC chip 504 (received via a sixth edge coupler (not shown) of the PIC chip 508) toward an optical receiver component (not shown) of the PIC chip 508.

In an embodiment, optical feedback techniques such as described above with reference to FIG. 5 are utilized in the example PIC chips 104 of FIGS. 1A-C. In other embodiments, the example PIC chips 104 of FIGS. 1A-C do not utilize optical feedback techniques such as described above with reference to FIG. 5. In other embodiments, optical feedback techniques such as described above with reference to FIG. 5 are utilized in other suitable PIC chips, different than the example PIC chips 104 of FIGS. 1A-C, that include testing components such as described herein.

Figure 6:
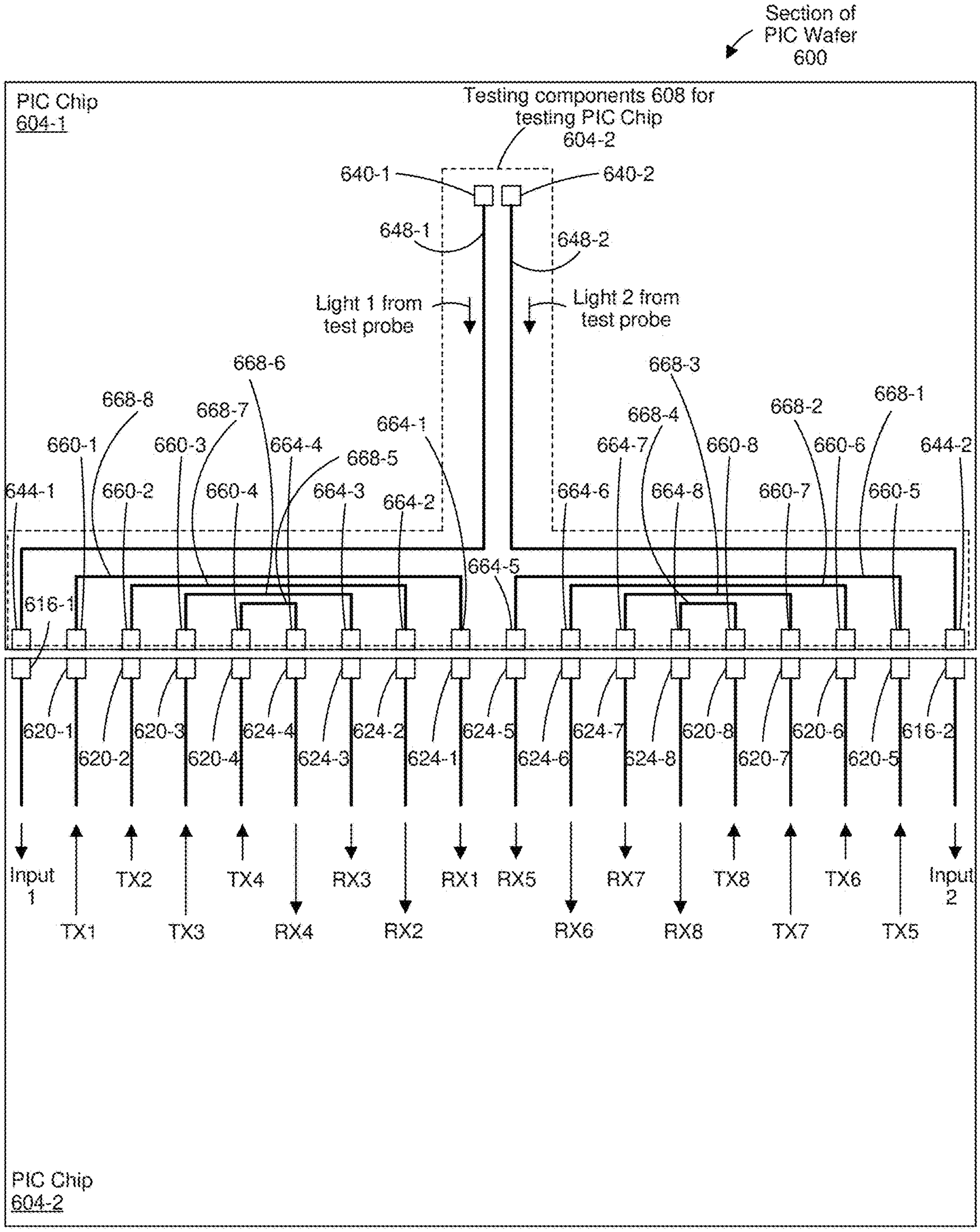
FIG. 6 is simplified diagram of a section of another example PIC wafer in which a first PIC chip includes testing components for testing one or more operational attributes of optical components of a second PIC chip, according to another embodiment.

FIG. 6 is simplified diagram of a section of an example PIC wafer 600, according to another embodiment. The section of the PIC wafer 600 includes a PIC chip 604-1 and a PIC chip 604-2. Although only two PIC chips 604 are illustrated in FIG. 6, the PIC wafer 600 includes many more than two PIC chips 604, like the example wafer 100 of FIG. 1B. In an embodiment, all of the PIC chips 604 of the PIC wafer 600 have a same structure. For example, the chip 604-1 and the PIC chip 604-2 have the same structure, in an embodiment. In other embodiments, most of the PIC chips 604 have the same structure, whereas one or more other PIC chips 604 have a different suitable structure.

The PIC chip 604-1 includes a plurality of optical components and optionally electrical components (not shown) corresponding to an end use of the PIC chip 604-1 that provides a desired functionality after the PIC chip 604-1 has been separated from other PIC chips 604 of the PIC wafer 600 and has been packaged in a suitable PIC package. For instance, in the example of FIG. 6, the PIC chip 604-1 includes optical components and electrical components related to i) optical modulation for generating multiple optical communication signals for transmission via one or more suitable optical media, and ii) demodulation of multiple optical signals as part of recovering data from multiple optical communication signals received via one or more suitable optical media. In other embodiments, the PIC chip 604-1 additionally includes optical components and optionally electrical components related to processing one or more optical signals in another suitable other than optical modulation or optical demodulation, such as filtering one or more optical signals, optically multiplexing optical signals, optically demultiplexing optical signals, etc.

The PIC chip 604-1 also includes a plurality of optical components and optionally electrical components (i.e., testing components 608) that are configured to facilitate testing of one or more operational attributes of optical components disposed on a PIC chip 604 that is adjacent to the PIC chip 604-1, e.g., the PIC chip 604-2. As will be described further below, the testing components 608 provide one or more mechanisms for i) receiving light from a testing probe mechanism and transferring the light to the PIC chip 604-2, and ii) receiving light from the PIC chip 604-2 and feeding back the light to the PIC chip 604-2. As the PIC chips 604-1 and 604-2 have the same structure, the PIC chip 604-2 also includes testing components (not shown) like the testing components 608.

The PIC chip 604-2 includes edge couplers 616 that are configured to receive light from one or lasers when the PIC chip 604-2 is in an end use product form, e.g., after the PIC chip 604-2 has been separated from other PIC chips 604 of the PIC wafer 600 and has been packaged in a suitable PIC package. The edge couplers 616 are optically coupled to optical modulators (e.g., MZMs; not shown) via respective waveguides. The optical modulators of the PIC chip 604-2 generate eight transmitter output signals TX1-TX8, which are transferred to respective edge couplers 620 via waveguides, and the edge couplers 620 are configured to output the transmitter output signals TX1-TX8.

The PIC chip 604-2 includes edge couplers 624 that are configured to receive modulated light signals RX1-RX8 via one or more optical media when the PIC chip 604-2 is in an end use product form, e.g., after the PIC chip 604-2 has been separated from other PIC chips 604 of the PIC wafer 600 and has been packaged in a suitable PIC package. The edge couplers 624 are optically coupled to optical demodulators (not shown) via respective waveguides (not shown).

As the PIC chips 604-1 and 604-2 have the same structure, the PIC chip 604-1 also includes edge couplers, optical modulators (not shown), optical demodulators (not shown), and waveguides (not shown) like those of the PIC chip 604-2 discussed above.

Referring to the testing components 608 of the PIC chip 604-1, the testing components 608 include optical couplers 640 that are configured to receive light from a testing probe mechanism. To facilitate testing of the PIC chip 604-2 while the PIC chip 604-1 and the PIC chip 604-2 are integral with the PIC wafer 600, the optical couplers 640 are configured to receive light from a direction that is at an angle between approximately 60-90 degrees with respect to a plane that is parallel to the PIC wafer 600, in an embodiment. In another embodiment, the optical couplers 640 are configured to receive light from a direction that is at an angle between approximately 70-90 degrees with respect to the plane that is parallel to the PIC wafer 600. In another embodiment, the optical couplers 640 are configured to receive light from a direction that is at an angle between approximately 75-90 degrees with respect to the plane that is parallel to the PIC wafer 600. In other embodiments, the optical couplers 640 are configured to receive light from a direction that is at another suitable angle with respect to the plane that is parallel to the PIC wafer 600.

In an embodiment, the optical couplers 640 comprise grating couplers. In another embodiment, the optical couplers 640 comprise other suitable couplers different than grating couplers.

The testing components 608 of the PIC chip 604-1 also include edge couplers 644 that are optically aligned with the edge couplers 616 of the PIC chip 604-2. The edge couplers 644 are optically coupled to the optical couplers 640 via waveguides 648. In a testing operation, light from a testing probe mechanism is received by the optical couplers 640 and transferred to the edge couplers 644 via the waveguides 648. The edge couplers 644 are configured to output the light from the testing probe mechanism to the edge couplers 616 of the PIC chip 604-2.

The testing components 608 of the PIC chip 604-1 also include edge couplers 660 that are optically aligned with the edge couplers 620 of the PIC chip 604-2. In a testing operation, the light signals TX-TX8 output by the edge couplers 620 of the PIC chip 604-2 are received by the edge couplers 660.

The testing components 608 of the PIC chip 604-1 also include edge couplers 664 that are optically aligned with the edge couplers 624 of the PIC chip 604-2. The edge couplers 664 are optically coupled to the edge couplers 660 via waveguides 668, and the light signals TX1-TX8 received by the edge couplers 660 is fed back to the edge couplers 664 via the waveguides 668. In the testing operation, the light signals TX-TX8 output by the edge couplers 624 of the PIC chip 604-2 are received by the edge couplers 660 of the PIC chip 604-2 and fed back to the edge couplers 624 of the PIC chip 604-2 via the waveguides 668 and the edge couplers 664.

In a testing operation in which the PIC chip 604-2 is being tested, a testing probe mechanism is maneuvered over the wafer 600 proximate to the PIC chip 604-1 and the PIC chip 604-2 such that i) a lensed fiber array of the testing probe mechanism is aligned with the optical couplers 640 of the PIC chip 604-1, and ii) electrical contacts (e.g., pins, etc.) of the testing probe mechanism are aligned with and make contact with electrical pads (not shown) of the PIC chip 604-2. Optionally, other electrical contacts (e.g., pins, etc.) of the testing probe mechanism are aligned with and make contact with the electrical pads of the PIC chip 604-1 that correspond to the testing components 608.

The testing probe mechanism provides electrical signals (e.g., one or more of a ground signal, a power signal, modulation control signals, a biasing signal, high speed data signals (test data) for modulation by optical modulators under test, etc.) to electrical pads of the PIC chip 604-2 (and optionally electrical pads of the PIC chip 604-1). Additionally, the testing probe mechanism provides light signals to the optical couplers 640. The waveguides 648 and the edge couplers 644 provide the light signals from the testing probe mechanism to the edge couplers 616 of the PIC chip 604-2. In this way, the edge couplers 616 of the PIC chip 604-2 can be tested while the PIC chip 604-2 is still integral with the PIC wafer 600, which is not possible with typical PIC wafer testing techniques.

Light signals output by optical modulators of the PIC chip 604-2 are output by the edge couplers 620 of the PIC chip 604-2 and received by the edge couplers 660 of the PIC chip 604-1. The light signals received by the edge couplers 660 are fed back to the edge couplers 624 of the PIC chip 604-2 via the waveguides 668 and the edge couplers 664. In this way, the edge couplers 620 and the edge couplers 624 of the PIC chip 104-2 can also be tested while the PIC chip 604-2 is still integral with the PIC wafer 600, which is not possible with typical PIC wafer testing techniques.

Additionally, as light is transferred from the testing probe mechanism to the optical modulators, and light signals output by the optical modulators are fed back to the optical demodulators, operational attributes of the optical modulators and the optical demodulators can be tested while the PIC chip 604-2 is still integral with the PIC wafer 600.

The edge couplers 616, 620, 624 of the PIC chip 604-2, are often laterally spaced at different distances and/or laterally spaced at distances that are significantly longer than pitches of optical inputs/outputs of typical testing probes. The optical couplers 640 of the testing components 608 are equally spaced at a suitable distance that corresponds to a pitch of optical inputs/outputs of a typical optical testing probe, as discussed above, according to an embodiment. For example, the optical couplers 608 are equally spaced by 127 μm, or equally spaced by 250 μm, in some embodiments. Thus, the testing components 608 are configured to, in connection with testing the PIC chip 604-2, convert a lateral spacing of optical input/outputs of the PIC chip 604-2 from a first lateral spacing to a second lateral spacing that is uniform and shorter than the first spacing, according to some embodiments. The second spacing corresponds to a pitch of optical inputs/outputs of a typical optical testing probe, according to an embodiment. Converting a lateral spacing of optical input/outputs of the PIC chip 604-2 from the first lateral spacing to a standard fiber array optical pitch, reduces a testing probe cost and/or complexity, and removes the need for a custom optical block for the testing probe (which might be cost prohibitive and/or commercially infeasible), at least in some embodiments.

In an embodiment, optical feedback techniques such as described above with reference to FIG. 6 are utilized in the example PIC chips 104 of FIGS. 1A-C. In other embodiments, the example PIC chips 104 of FIGS. 1A-C do not utilize optical feedback techniques such as described above with reference to FIG. 6. In other embodiments, optical feedback techniques such as described above with reference to FIG. 6 are utilized in other suitable PIC chips, different than the example PIC chips 104 of FIGS. 1A-C, that include testing components such as described herein.

Figure 7:
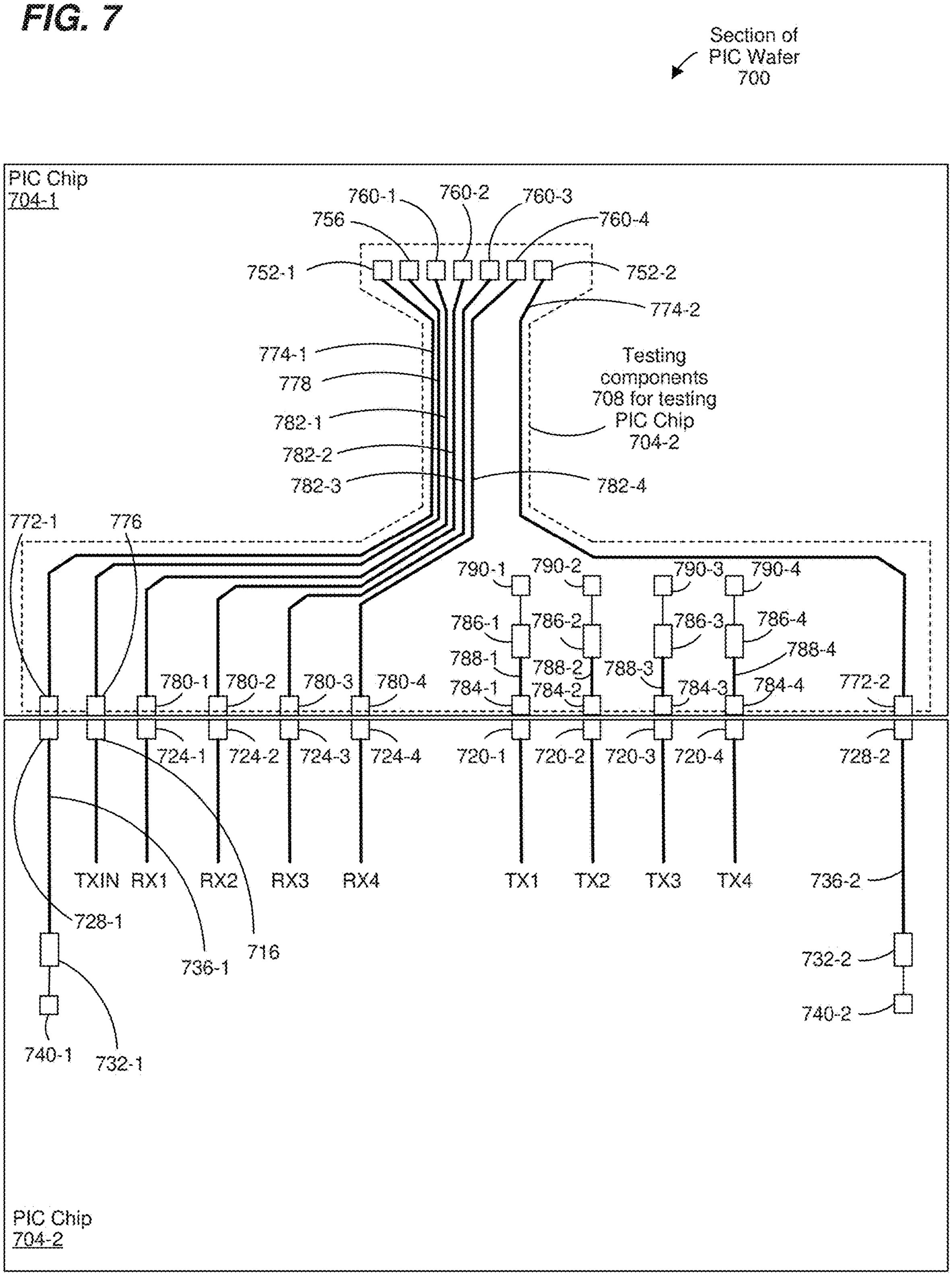
FIG. 7 is simplified diagram of a section of another example PIC wafer in which a first PIC chip includes testing components for testing one or more operational attributes of optical components of a second PIC chip, according to another embodiment.

FIG. 7 is simplified diagram of a section of another example PIC wafer 700, according to another embodiment. The section of the PIC wafer 700 includes a PIC chip 704-1 and a PIC chip 704-2. Although only two PIC chips 704 are illustrated in FIG. 7, the PIC wafer 700 includes many more than two PIC chips 704, like the example wafer 100 of FIG. 1B. In an embodiment, all of the PIC chips 704 of the PIC wafer 700 have a same structure. For example, the chip 704-1 and the PIC chip 704-2 have the same structure, in an embodiment. In other embodiments, most of the PIC chips 704 have the same structure, whereas one or more other PIC chips 704 have a different suitable structure.

The PIC chip 704-1 includes a plurality of optical components and optionally electrical components (not shown) corresponding to an end use of the PIC chip 704-1 that provides a desired functionality after the PIC chip 704-1 has been separated from other PIC chips 704 of the PIC wafer 700 and has been packaged in a suitable PIC package. For instance, in the example of FIG. 7, the PIC chip 704-1 includes optical components and electrical components related to i) optical modulation for generating multiple optical communication signals for transmission via one or more suitable optical media, and ii) demodulation of multiple optical signals as part of recovering data from multiple optical communication signals received via one or more suitable optical media. In other embodiments, the PIC chip 704-1 additionally includes optical components and optionally electrical components related to processing one or more optical signals in another suitable other than optical modulation or optical demodulation, such as filtering one or more optical signals, optically multiplexing optical signals, optically demultiplexing optical signals, etc.

The PIC chip 704-1 also includes a plurality of optical components and electrical components (i.e., testing components 708) that are configured to facilitate testing of one or more operational attributes of optical components disposed on a PIC chip 704 that is adjacent to the PIC chip 704-1, e.g., the PIC chip 704-2. As will be described further below, the testing components 708 provide one or more mechanisms for i) receiving light from a testing probe mechanism and transferring the light to the PIC chip 704-2, and ii) receiving light from the PIC chip 704-2 and processing the light received from the PIC chip 704-2. As the PIC chips 704-1 and 704-2 have the same structure, the PIC chip 704-2 also includes testing components (not shown) like the testing components 708.

The PIC chip 704-2 includes an edge couplers 716 that is configured to receive light from a laser when the PIC chip 704-2 is in an end use product form, e.g., after the PIC chip 704-2 has been separated from other PIC chips 704 of the PIC wafer 700 and has been packaged in a suitable PIC package. The edge coupler 716 is optically coupled to optical modulators (e.g., MZMs; not shown) via respective waveguides (not shown). The optical modulators of the PIC chip 704-2 generate four transmitter output signals TX1-TX4, which are transferred to respective edge couplers 720 via waveguides, and the edge couplers 720 are configured to output the transmitter output signals TX1-TX4. Although one edge coupler 716 is illustrated in FIG. 7, the PIC chip 704-2 includes multiple edge couplers 716 that are configured to receive light from one or more lasers when the PIC chip 704-2 is in an end use product form, in other embodiments.

The PIC chip 704-2 includes edge couplers 724 that are configured to receive modulated light signals RX1-RX4 via one or more optical media when the PIC chip 704-2 is in an end use product form, e.g., after the PIC chip 704-2 has been separated from other PIC chips 704 of the PIC wafer 700 and has been packaged in a suitable PIC package. The edge couplers 724 are optically coupled to optical demodulators (not shown) via respective waveguides.

The PIC chip 704-2 includes edge couplers 728 that are associated with aligning a testing probe mechanism, as will be described below, according to an embodiment. The edge couplers 728 are optically coupled with photodiodes 732 via waveguides 736. Outputs of the photodiodes 732 are electrically coupled to electrical pads 740 via circuit traces. In some embodiments, the PIC chip 704-2 includes other electrical pads and circuit traces (not shown) configured to provide ground, power, and/or biasing signals to the photodiodes 732.

As the PIC chips 704-1 and 704-2 have the same structure, the PIC chip 704-1 also includes edge couplers, optical modulators (not shown), optical demodulators (not shown), waveguides (not shown), and electrical traces and pads (not shown) like those of the PIC chip 704-2 discussed above.

Referring to the testing components 708 of the PIC chip 704-1, the testing components 708 include optical couplers 752 that are configured to receive light from a testing probe mechanism in connection with aligning the testing probe mechanism, as will be described below, according to an embodiment. The testing components 708 also include one or more optical couplers 756 that are configured to receive light from the testing probe, the light received via the one or more optical couplers 756 to be provided to one or more optical transmitter components of the PIC chip 704-2 as discussed further below, according to an embodiment. The testing components 708 also include optical couplers 760 that are configured to receive light from the testing probe, the light received via the optical couplers 760 to be provided to optical receiver components of the PIC chip 704-2 as discussed further below, according to an embodiment.

To facilitate testing of the PIC chip 704-2 while the PIC chip 704-1 and the PIC chip 704-2 are integral with the PIC wafer 700, the optical couplers 752, 756, 760 are configured to receive light from a direction that is at an angle between approximately 60-90 degrees with respect to a plane that is parallel to the PIC wafer 700, in an embodiment. In another embodiment, the optical couplers 752, 756, 760 are configured to receive light from a direction that is at an angle between approximately 70-90 degrees with respect to the plane that is parallel to the PIC wafer 700. In another embodiment, the optical couplers 752, 756, 760 are configured to receive light from a direction that is at an angle between approximately 75-90 degrees with respect to the plane that is parallel to the PIC wafer 700. In other embodiments, the optical couplers 752, 756, 760 are configured to receive light from a direction that is at another suitable angle with respect to the plane that is parallel to the PIC wafer 700.

In an embodiment, the optical couplers 752, 756, 760 comprise grating couplers. In another embodiment, the optical couplers 752, 756, 760 comprise other suitable couplers different than grating couplers.

The testing components 708 of the PIC chip 704-1 also include edge couplers 772 that are optically aligned with the edge couplers 728 of the PIC chip 704-2. The edge couplers 772 are optically coupled to the optical couplers 752 via waveguides 774. In a testing operation, light from a testing probe mechanism is received by the optical couplers 752 and transferred to the edge couplers 772 via the waveguides 774. The edge couplers 772 are configured to output the light from the testing probe mechanism to the edge couplers 728 of the PIC chip 704-2. As will be described further below, electrical outputs of the photodiodes 732, which are optically coupled to the edge couplers 728, can be used to determine when the testing probe is adequately aligned with the optical couplers 752, 756, 760, in an embodiment.

The testing components 708 of the PIC chip 704-1 also include one or more edge couplers 776 that are optically aligned with the one or more edge couplers 716 of the PIC chip 704-2. The one or more edge couplers 776 are optically coupled to the one or more optical couplers 756 via one or more waveguides 778. In a testing operation, light from the testing probe mechanism is received by the one or more optical couplers 756 and transferred to the one or more edge couplers 776 via the one or more waveguides 778. The one or more edge couplers 776 are configured to output the light from the testing probe mechanism to the one or more edge couplers 716 of the PIC chip 704-2.

The testing components 708 of the PIC chip 704-1 also include edge couplers 780 that are optically aligned with the edge couplers 724 of the PIC chip 704-2. The edge couplers 780 are optically coupled to the optical couplers 760 via waveguides 782. In a testing operation, light signals received via the optical couplers 760 are transferred to the edge couplers 780 via the waveguides 782, and the light signals output by the edge couplers 780 are received by the edge couplers 724 of the PIC chip 704-2.

The testing components 708 of the 7IC chip 604-1 further include edge couplers 784 that are optically aligned with the edge couplers 720 of the PIC chip 704-2. The edge couplers 784 are optically coupled with photodiodes 786 via waveguides 788. Outputs of the photodiodes 788 are electrically coupled to electrical pads 790 via circuit traces. In some embodiments, the PIC chip 704-2 includes other electrical pads and circuit traces (not shown) configured to provide ground, power, and/or biasing signals to the photodiodes 786.

In a testing operation, light output by optical transmitter components of the PIC chip 704-2 (e.g., TX1-TX4) is output by the edge couplers 720 of the PIC chip 704-2 and received by the edge couplers 784 of the PIC chip 704-1. As will be described further below, electrical outputs of the photodiodes 786, which are optically coupled to the edge couplers 784, can be used to test one or more optical characteristics (e.g., operational attributes) of the optical transmitter components and/or the edge couplers 720 of the PIC chip 704-2, in an embodiment.

In a testing operation in which the PIC chip 704-2 is being tested, a testing probe mechanism is maneuvered over the wafer 700 proximate to the PIC chip 704-1 and the PIC chip 704-2 such that i) a lensed fiber array of the testing probe mechanism is aligned with the optical couplers 756, 760 of the PIC chip 704-1, ii) electrical contacts (e.g., pins, etc.) of the testing probe mechanism are aligned with and make contact with electrical pads of the PIC chip 704-2 such as the electrical pads 740, and iii) electrical contacts (e.g., pins, etc.) of the testing probe mechanism are aligned with and make contact with electrical pads of the PIC chip 704-1 such as the electrical pads 790.

The testing probe mechanism provides electrical signals (e.g., one or more of a ground signal, a power signal, modulation control signals, a biasing signal, high speed data signals (test data) for modulation by optical modulators under test, etc.) to electrical pads of the PIC chip 704-2 (e.g., the electrical pads 740) and electrical pads of the PIC chip 704-1 (e.g., the electrical pads 790).

Alignment light signals output by the testing probe are received by the optical couplers 752 and transferred to the edge couplers 772 via the waveguides 774. The edge couplers 772 output the light signals to the edge couplers 728 of the PIC chip 704-2. The light signals received by the edge couplers 728 are transferred to the photodiodes 732 via the waveguides 736. Electrical outputs of the photodiodes 732 are received by the testing probe mechanism via the electrical pads 740, and a testing controller (not shown) uses the electrical outputs of the photodiodes 732 to determine when the testing probe mechanism is satisfactorily aligned with the optical couplers 756, 760, according to an embodiment.

Additionally, the testing probe mechanism provides one or more light signals to the one or more optical couplers 756. The one or more waveguides 778 and the one or more edge couplers 776 provide the one or more light signals from the testing probe mechanism to the one or more edge couplers 716 of the PIC chip 704-2. In this way, the one or more edge couplers 716 of the PIC chip 704-2 can be tested while the PIC chip 704-2 is still integral with the PIC wafer 700, which is not possible with typical PIC wafer testing techniques.

The one or more light signals received by the one or more edge couplers 716 of the PIC chip 704-2 are provided to optical transmitter components (e.g., optical modulators; not shown) of the PIC chip 704-2. Transmitter optical signals TX1-TX4 output by optical modulators of the PIC chip 704-2 are output by the edge couplers 720 of the PIC chip 704-2 and received by the edge couplers 784 of the PIC chip 704-1. The light signals received by the edge couplers 784 are transferred to the photodiodes 786 via the waveguides 788. Electrical outputs of the photodiodes 786 are received by the testing probe mechanism via the electrical pads 790, and a testing controller (not shown) uses the electrical outputs of the photodiodes 786 to test optical characteristics (e.g., operational attributes) of the edge couplers 720 and the transmitter components (e.g., optical modulators; not shown) of the PIC chip 704-2, according to an embodiment. In this way, the edge couplers 720 of the PIC chip 704-2 can be tested while the PIC chip 704-2 is still integral with the PIC wafer 700, which is not possible with typical PIC wafer testing techniques.

Additionally, as light is transferred from the testing probe mechanism to the optical transmitter components (e.g., optical modulators) of the PIC chip 704-2, operational attributes of the optical transmitter components can be tested while the PIC chip 704-2 is still integral with the PIC wafer 700.

Additionally, the testing probe mechanism provides a plurality of light signals to the optical couplers 760. The waveguides 782 and the one or more edge couplers 780 provide the plurality of light signals from the testing probe mechanism to the one or more edge couplers 724 of the PIC chip 704-2. In this way, the edge couplers 724 of the PIC chip 704-2 can be tested while the PIC chip 704-2 is still integral with the PIC wafer 700, which is not possible with typical PIC wafer testing techniques.

The light signals received by the edge couplers 724 of the PIC chip 704-2 are provided to optical receiver components (e.g., optical demodulators; not shown) of the PIC chip 704-2. In this way, the edge couplers 720 of the PIC chip 704-2 can be tested while the PIC chip 704-2 is still integral with the PIC wafer 700, which is not possible with typical PIC wafer testing techniques.

Additionally, as light is transferred from the testing probe mechanism to the optical receiver components (e.g., optical demodulators) of the PIC chip 704-2, operational attributes of the optical receiver components can be tested while the PIC chip 704-2 is still integral with the PIC wafer 700.

The edge couplers 716, 720, 724, 728 of the PIC chip 704-2, are often laterally spaced at different distances and/or laterally spaced at distances that are significantly longer than pitches of optical inputs/outputs of typical testing probes. The optical couplers 752, 756, 760 of the testing components 708 are equally spaced at a suitable distance that corresponds to a pitch of optical inputs/outputs of a typical optical testing probe, as discussed above, according to an embodiment. For example, the optical couplers 708 are equally spaced by 127 μm, or equally spaced by 250 μm, in some embodiments. Thus, the testing components 708 are configured to, in connection with testing the PIC chip 704-2, convert a lateral spacing of optical input/outputs of the PIC chip 704-2 from a first lateral spacing to a second lateral spacing that is uniform and shorter than the first spacing, according to some embodiments. The second spacing corresponds to a pitch of optical inputs/outputs of a typical optical testing probe, according to an embodiment. Converting a lateral spacing of optical input/outputs of the PIC chip 704-2 from the first lateral spacing to a standard fiber array optical pitch, reduces a testing probe cost and/or complexity, and removes the need for a custom optical block for the testing probe (which might be cost prohibitive and/or commercially infeasible), at least in some embodiments.

In an embodiment, one or more techniques such as described above with reference to FIG. 7 are utilized in the example PIC chips 104 of FIGS. 1A-C and/or the example PIC chips 604 of FIG. 6. In other embodiments, the example PIC chips 104 of FIGS. 1A-C and/or the example PIC chips 604 of FIG. 6 do not utilize optical feedback techniques such as described above with reference to FIG. 7. In other embodiments, techniques such as described above with reference to FIG. 7 are utilized in other suitable PIC chips, different than the example PIC chips 104 of FIGS. 1A-C and the example PIC chips 604 of FIG. 6, that include testing components such as described herein.

Figure 8A:
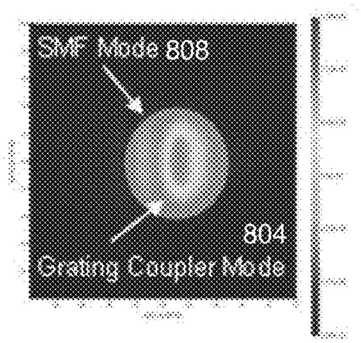
FIG. 8A is a diagram of a mode of a prior art grating coupler and a near-Gaussian mode 808 of a single mode fiber (SMF) when the modes are aligned.

Typical optical testing probe mechanisms use 6-axis positioners integrated into a custom engineered probe to actively align to sub-micron accuracy optical inputs/outputs to wafer grating couplers because larger than sub-micron accuracy can lead to significant degradation in coupling efficiency between a testing probe and a grating coupler. FIG. 8A is a diagram of a mode 804 of a prior art grating coupler and a near-Gaussian mode 808 of a single mode fiber (SMF) when the modes 804, 808 are aligned. The x axis and the y axis correspond to x and y positions, respectively, and are in units of μm. A typical mode field size of a prior art grating coupler mode is around 5×7 μm and the typical mode field diameter (MFD) of the SMF is typically 10 μm.

Figure 8B:
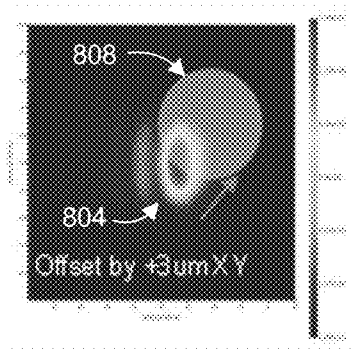
FIG. 8B is a diagram of the modes of FIG. 8A when the modes are relatively displaced by 3 μm.

A degree of overlap of the modes 804, 808, and thus coupling efficiency, reduces drastically when the modes 804, 808 are not aligned. FIG. 8B is a diagram of the modes 804, 808 of FIG. 8A when the modes 804, 808 are relatively displaced by 3 μm, which is a typical displacement due to the walkoff repeatability of typical wafer probes. As with FIG. 8A, the x axis and the y axis correspond to x and y positions, respectively, and are in units of μm. With a displacement of 3 μm, such as illustrated in FIG. 8B, the coupling efficiency can be reduced by 4 to 5 dB, which is not desirable. Additionally, misalignment by more than 3 μm can be expected due to limitations of accurately aligning a fiber array of the testing probe apparatus to the wafer grating couplers without the use of 6-axis positioners discussed above. As a result, it is difficult to achieve acceptable coupling efficiencies without the use of sub-micron active alignment.

Figure 9A:
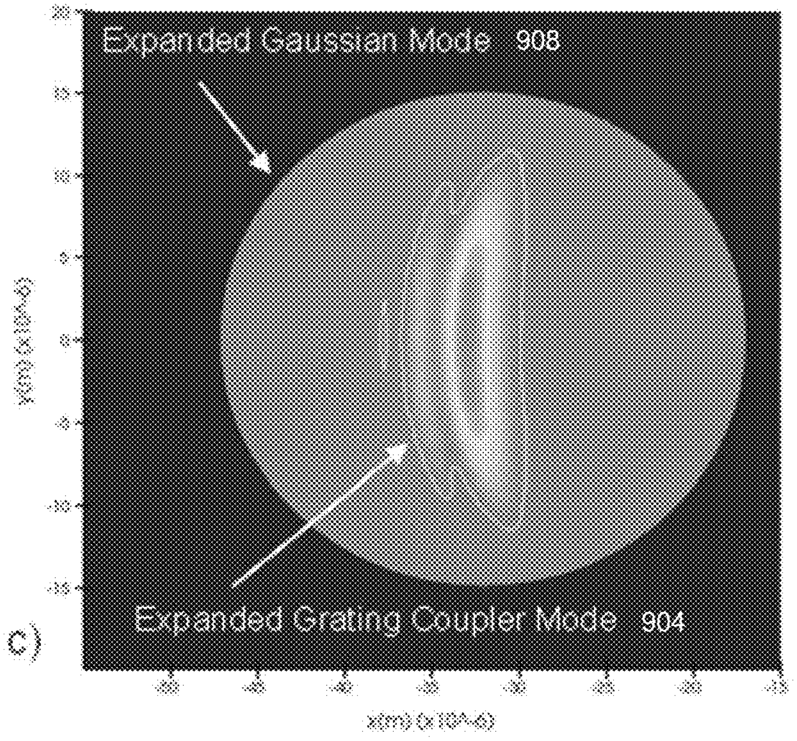
FIG. 9A is a diagram of an expanded mode of an example grating coupler and an expanded near-Gaussian mode of an example SMF when the modes are aligned, according to an embodiment.

In some embodiments, to reduce the need for sub-micron alignment of a fiber array of the testing probe mechanism with optical couplers of PIC chips such as described above, the modes of fibers of the fiber array of the testing probe mechanism and modes of the optical couplers are expanded with respect to prior art grating couplers and SMF fibers. FIG. 9A is a diagram of an expanded mode 904 of an example grating coupler and an expanded near-Gaussian mode 908 of an example SMF when the modes 904, 908 are aligned, according to an embodiment. The x axis and the y axis correspond to x and y positions, respectively, and are in units of μm. The mode field size of the grating coupler mode 904 is approximately 8×24 μm, and the MFD of the expanded Gaussian mode 908 is approximately 30 μm.

Figure 9B:
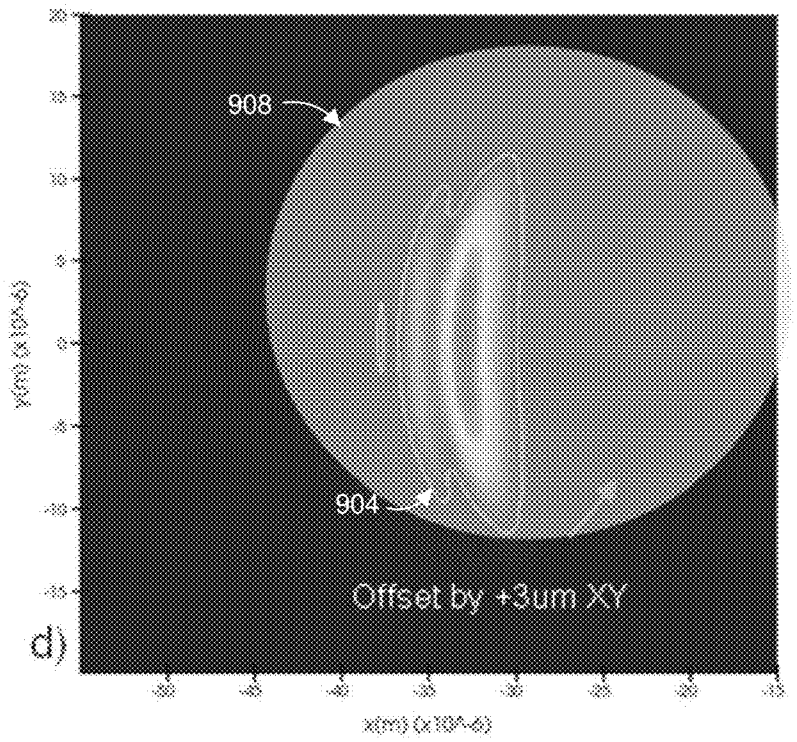
FIG. 9B is a diagram of the modes of FIG. 9A when the modes are relatively displaced by 3 μm.

FIG. 9B is a diagram of the modes 904, 908 of FIG. 9A when the modes 904, 908 are relatively displaced by 3 μm, which is a typical displacement due to the walkoff repeatability of typical wafer probes. As with FIG. 9A, the x axis and the y axis correspond to x and y positions, respectively, and are in units of μm.

In contrast to the situation with the smaller modes 804, 808 of FIG. 8B, a degree of overlap of the modes 904, 908 in FIG. 9B is relatively unchanged as compared to the aligned modes 904, 908 of FIG. 9A, and thus coupling efficiency remains relatively constant with the relative displacement of 3 μm. Experimental testing has demonstrated that coupling efficiency of expanded modes, such as the example modes 904, 908 of FIGS. 9A-B, stays within approximately 0.2 dB with a typical 3 μm X-Y repeatability displacement. Thus, expanded modes, such as the example modes 904, 908 of FIGS. 9A-B, provide significantly larger tolerance to the test probe movement misalignments, and it is therefore possible to repeatably achieve suitable coupling between testing probe mechanisms and optical couplers of PIC chips without the use of sub-micron active alignment, at least in some embodiments.

In the example of FIGS. 9A-B, a width of the mode 904 of the grating coupler parallel to the y axis is significantly larger than a width of the mode 904 parallel to the x axis. In other embodiments, the grating coupler is designed so that a width of the mode of the grating coupler parallel to the x axis is significantly closer to width of the mode of the grating coupler parallel to the y axis as compared to the mode 904 illustrated in FIGS. 9A-B.

Figure 10A:
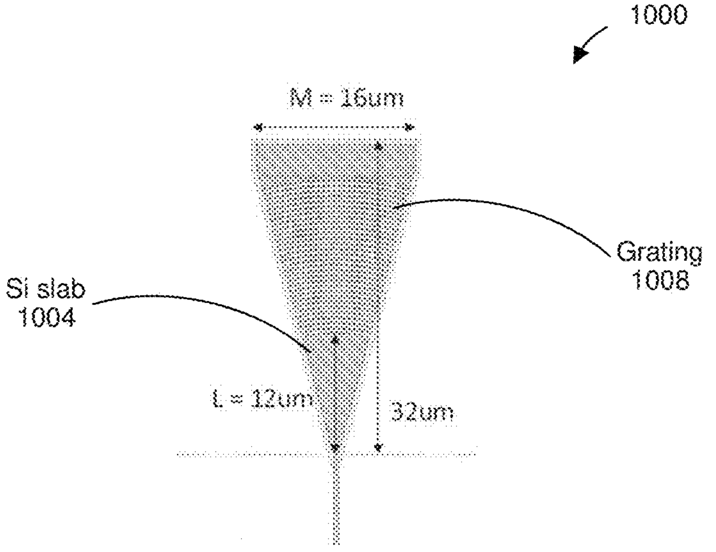
FIG. 10A is a diagram of a typical grating coupler for a 10 μm SMF mode field diameter (MFD).

FIG. 10A is a diagram of a typical grating coupler 1000 for a 10 μm SMF mode MFD. The grating coupler 1000 includes an Si slab 1004 and a grating 1008. A width (M) of the grating coupler 1000 is 16 μm, and an overall length of the grating coupler 1000 is 32 μm. A length (L) of the Si slab 1004 12 μm. A period of the grating 1008 is selected based on a wavelength of light with which the grating coupler 1000 is to be used.

Figure 10B:
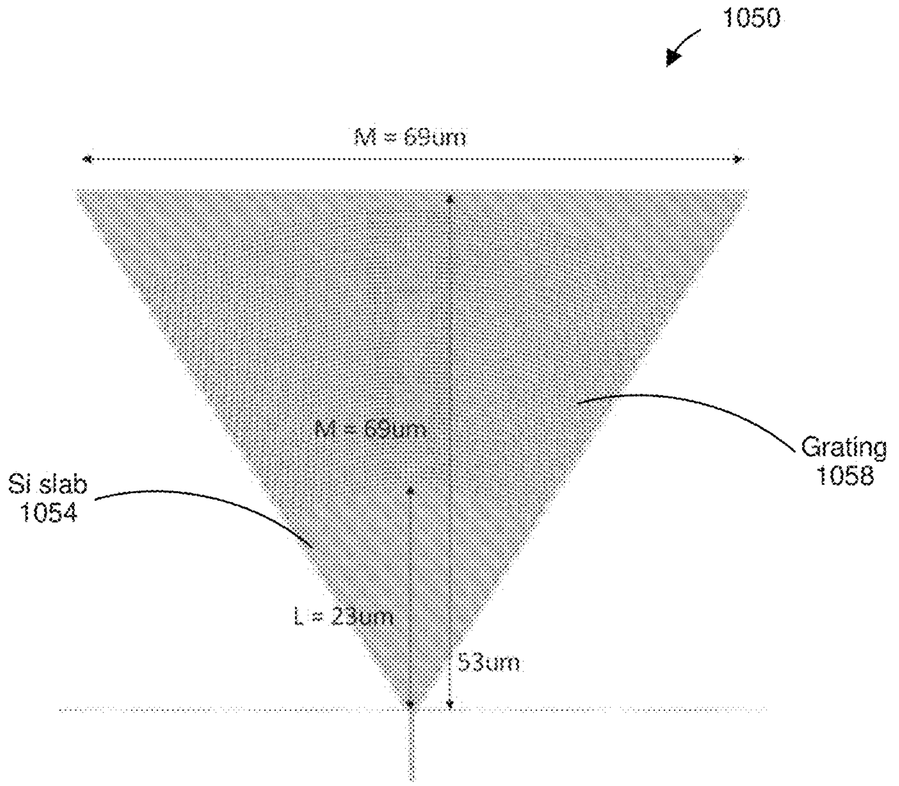
FIG. 10B is a diagram of an example grating coupler for an expanded SMF mode MFD that is used in one or more of the PIC chips of FIG. 1A, 6, or 7, according to some embodiments.

FIG. 10B is a diagram of an example grating coupler 1050 for an expanded 30 μm SMF mode MFD, according to an embodiment. The grating coupler 1050 includes an Si slab 1054 and a grating 1058. To expand a mode of the grating coupler 1050 as compared to the grating coupler 1000 of FIG. 10A, a length (L) of the Si slab 1054 is increased with respect to the length of the Si slab 1004, and a width (M) of the grating coupler 1050 is increased with respect to the width of the grating coupler 1000 of FIG. 10A, in an embodiment. For instance, a width (M) of the grating coupler 1050 is 69 μm, and a length (L) of the Si slab 1054 is 23 μm. An overall length of the grating coupler 1050 is 53 μm, and a period of the grating 1058 is selected based on a wavelength of light with which the grating coupler 1050 is to be used.

The greater length (L) of the Si slab 1054 and the greater width (M) of the grating coupler 1050, as compared to the grating coupler 1000, increases divergence of an optical mode in the slab 1054 before it is outcoupled by the grating 1058, according to an embodiment. The greater length (L) of the Si slab 1054 also allows for a longer propagation distance in a diverging slab mode as compared to the grating coupler 1000, in an embodiment.

In some embodiments, further expansion of the mode of the grating coupler 1050 in the propagation direction to match a size and shape of an expanded gaussian mode of the testing probe fiber is achieved via apodization of a grating period of the grating 1058 and/or using a weaker, lower-index SiN grating structure.

Although example dimensions were described with reference to FIG. 10B, in other embodiments a grating coupler has other suitable dimensions. For example, the length (L) of the Si slab 1054 is at least 18 μm, in some embodiments. The length (L) of the Si slab 1054 is at least 20 μm, in other embodiments. The length (L) of the Si slab 1054 is at least 24 μm, in other embodiments. The width (M) of the grating coupler 1050 is at least 48 μm, in some embodiments. The width (M) of the grating coupler 1050 is at least 54 μm, in other embodiments. The width (M) of the grating coupler 1050 is at least 64 μm, in other embodiments. The width (M) of the grating coupler 1050 is at least 72 μm, in other embodiments.

In other embodiments, the grating coupler 1050 has a suitable shape different than the shape illustrated in FIG. 10B.

In other embodiments, the grating coupler 1050 is fabricated using suitable materials different than or in addition those described above with reference to FIG. 10B. For example, the grating 1058 comprises silicon nitride on a slab comprising one or more layers of one or more suitable materials such as one or more of silicon, silicon dioxide, BOX, etc., in another embodiment.

In some embodiments, the optical couplers 160, 176 (FIG. 1A), the optical couplers 640 (FIG. 6), and/or the optical couplers 752, 756, 760 (FIG. 7) have a structure the same as or similar to any of the grating couplers described with reference to FIG. 10B. In other embodiments, the optical couplers 160, 176 (FIG. 1A), the optical couplers 640 (FIG. 6), and/or the optical couplers 752, 756, 760 (FIG. 7) have a suitable structure different than the grating couplers described with reference to FIG. 10B.

Figure 11A:
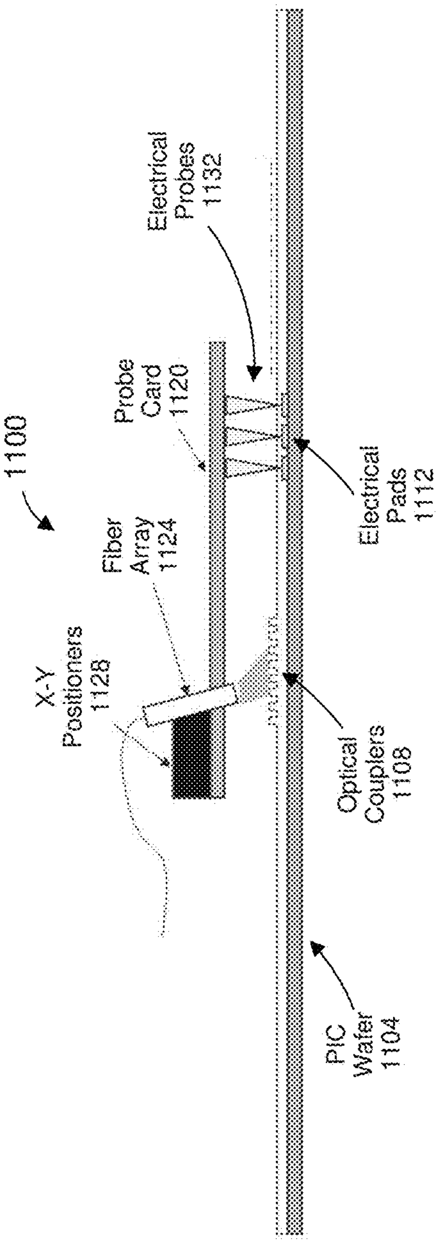
FIG. 11A is a simplified block diagram of an example testing probe mechanism for testing PIC wafers such as described herein, according to an embodiment.

FIG. 11A is a simplified block diagram of an example testing probe mechanism 1100 for testing PIC wafers such as described above, according to an embodiment. The testing probe mechanism 1100 is illustrated as positioned over a PIC wafer 1104 having optical couplers 1108 and electrical pads 1112. For example, the PIC wafer 1104 corresponds to the PIC wafer 100 of FIGS. 1A-C, the optical couplers 1108 correspond to the optical couplers 160, 176, and the electrical pads 1112 correspond to electrical pads of the PIC chip 104-1 and/or the PIC chip 104-2, such as the electrical pads 116 or other electrical pads, according to an embodiment. As another example, the PIC wafer 1104 corresponds to the PIC wafer 600 of FIG. 6, the optical couplers 1108 correspond to the optical couplers 640, and the electrical pads 1112 correspond to electrical pads of the PIC chip 604-1 and/or the PIC chip 604-2, according to another embodiment. As another example, the PIC wafer 1104 corresponds to the PIC wafer 700 of FIG. 7, the optical couplers 1108 correspond to the optical couplers 752, 756, 760, and the electrical pads 1112 correspond to electrical pads 740 of the PIC chip 604-1 and the electrical pads 790 of the PIC chip 604-2, and/or other electrical pads of the PIC chip 704-1 and/or the PIC chip 704-2, according to another embodiment.

In other embodiments, the PIC wafer 1104 corresponds to a suitable PIC wafer different than the PIC wafers 100, 600, 700. In other embodiments, the PIC wafers 100, 600, 700 are tested using a suitable testing probe mechanism different than the example testing probe mechanism 1100 of FIG. 11A.

The testing probe mechanism 1100 includes a probe card 1120. The testing probe mechanism 1100 also includes an end-fire lensed fiber array 1124. Additionally, X-Y fine positioners 1128 are coupled to the probe card 1120 and the fiber array 1124. The X-Y fine positioners 1128 are used to align the fiber array 1124 to electrical probes 1132 of the testing probe mechanism 1100. The electrical probes 1132 are coupled to the probe card 1120. The X-Y fine positioners 1128 allows end-user field tuning in case of over-temperature mechanical expansion/contraction, tip wear of the electrical probes, accommodation of changes in electrical probe needle overdrive, etc. In other embodiments, the X-Y fine positioners 1128 are omitted and the fiber array 1124 is mounted to the probe card. In such embodiments, the fiber array 1124 and/or the electrical probes 1132 are adjusted and fixed into positional alignment assembly of the testing probe mechanism 1100.

Figure 11B:
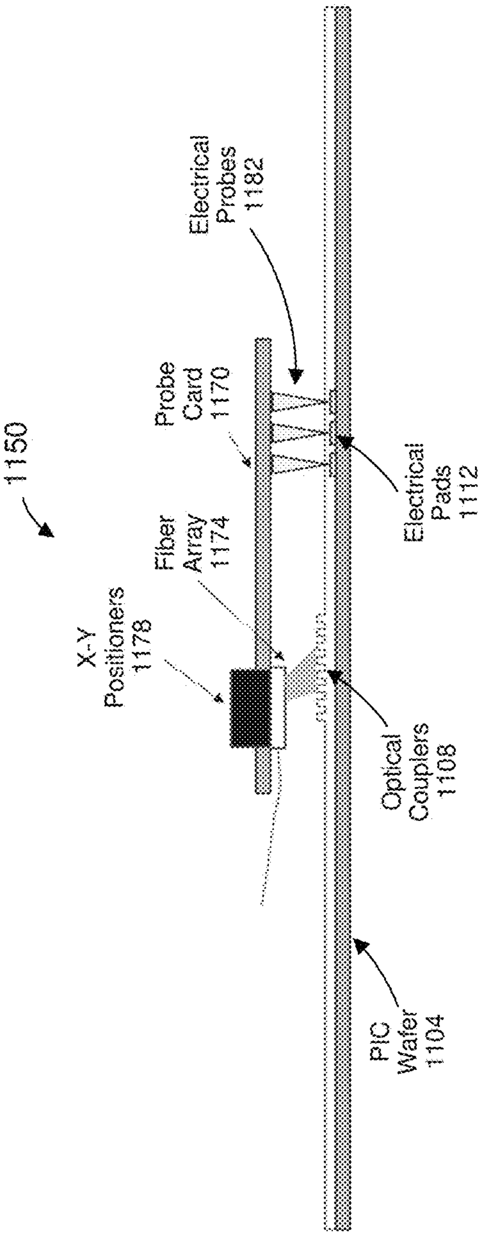
FIG. 11B is a simplified block diagram of another example testing probe mechanism for testing PIC wafers such as described herein, according to another embodiment.

FIG. 11B is a simplified block diagram of another example testing probe mechanism 1150 for testing PIC wafers such as described above, according to another embodiment. The testing probe mechanism 1150 is illustrated as positioned over the PIC wafer 1104 discussed above with reference to FIG. 11A.

The testing probe mechanism 1150 includes a probe card 1170. The testing probe mechanism 1100 also includes an in-plane coupled lensed fiber array 1174. Additionally, X-Y fine positioners 1178 are coupled to the probe card 1170 and the fiber array 1174. The X-Y fine positioners 1178 are used to align the fiber array 1174 to electrical probes 1182 of the testing probe mechanism 1150. The electrical probes 1182 are coupled to the probe card 1170. The X-Y fine positioners 1178 allows end-user field tuning in case of over-temperature mechanical expansion/contraction, tip wear of the electrical probes, accommodation of changes in electrical probe needle overdrive, etc. In other embodiments, the X-Y fine positioners 1178 are omitted and the fiber array 1174 is mounted to the probe card. In such embodiments, the fiber array 1174 and/or the electrical probes 1182 are adjusted and fixed into positional alignment assembly of the testing probe mechanism 1150.

Referring now to FIGS. 11A-B, changes in the z-height directly affect the coupling position on the PIC wafer 1104 since the light is coupled at an angle, for example approximately 10°, according to some embodiments. Thus, for example, a 20 μm wear out plus 20 μm of additional overdrive will decrease a working distance by 40 μm and a relative X position by 40*tan (10°), which is approximately 7 μm, according to some embodiments.

The lensed arrays 1124, 1174 are configured to generate an expanded mode, such as described with reference to FIG. 9B, at a relatively long working distance, e.g., 200 μm or another suitable working distance, in some embodiments. The electrical probes 1132, 1182 employ any suitable electrical probe technology, such as cantilever, vertical probes, membranes, pins, needles, etc.

As described above, a lateral distance between the lensed arrays 1124, 1174 and the electrical probes 1132, 1182 enables use of electrical probe technology such as vertical pins, membrane probe cards, etc., that cannot easily be cut open or otherwise adapted to allow insertion of an optical array, at least in some embodiments.

A testing probe mechanism such as described above (e.g., the testing probe mechanism 1100, the testing probe mechanism 1150, etc.) is a component of a wafer testing apparatus. The wafer testing apparatus comprises components such as one or more of a power supply, lasers for generating light signals that are output by the testing probe mechanism, analog-to-digital converters (ADCs) for converting analog signals received by the testing probe mechanism to digital signals for processing by the testing apparatus, electrical signal generators for generating electrical testing signals, such as described above, that are output by the testing probe mechanism, optical processors for processing light signals received by the testing probe mechanism, etc., in various embodiments. The wafer testing apparatus also comprises one or more computer processors that execute machine readable instructions that, when executed by the one or more computer processors, cause the one or more computer processors to process electrical signals and/or optical signals received by the testing probe mechanism, in some embodiments. The machine readable instructions, when executed by the one or more computer processors, also cause the one or more computer processors to analyze operational attributes of optical components disposed on PIC chips by processing electrical signals and/or optical signals received by the testing probe mechanism, in some embodiments. The machine readable instructions are stored in one or more memory devices of the wafer testing apparatus, in some embodiments.

FIG. 12 is a flow diagram of an example method 1200 for testing PIC chips integral with a PIC wafer, according to an embodiment. The method 1200 is implemented in connection with the PIC wafer 100 of FIGS. 1A-C, the PIC wafer 600 of FIG. 6, and/or the PIC wafer 700 of FIG. 7, according to various embodiments, and the method 1200 is described with reference to FIGS. 1A, 6, and 7 for case of explanation. The method 1200 is implemented in connection with another suitable PIC wafer different than the PIC wafer 100 of FIGS. 1A-C, the PIC wafer 600 of FIG. 6, and the PIC wafer 700 of FIG. 7, according to other embodiments. The PIC wafer 100 of FIGS. 1A-C, the PIC wafer 600 of FIG. 6, and/or the PIC wafer 700 are tested using another suitable method different than the method 1200, according to some embodiments.

The method 1200 involves using the testing probe mechanism 1100 of FIG. 11A or the testing probe mechanism 1150 of FIG. 11B, according to some embodiments, and the method 1200 is described with reference to FIGS. 11A-B for case of explanation. The method 1200 is implemented using another suitable testing probe mechanism different than the testing probe mechanisms 1100, 1150 of FIGS. 11A-B, in other embodiments. The testing probe mechanism 1100 of FIG. 11A and/or the testing probe mechanism 1150 of FIG. 11B are used in other suitable methods for testing PIC chips integral with a PIC wafer different than the method 1200, in some embodiments.

At block 1204, a testing probe mechanism is maneuvered over the PIC wafer proximate to an optical coupler among a plurality of optical testing components of a first PIC chip of the PIC wafer. The first PIC chip also comprises one or more optical communication components separate from the plurality of optical testing components, in an embodiment. In some embodiments, the one or more optical communication components separate from the plurality of optical testing components correspond to an end use of the first PIC chip that provides a desired functionality after the first PIC chip has been separated from other PIC chips of the PIC wafer and has been packaged in a suitable PIC package. In an embodiment, the one or more optical communication components separate from the plurality of optical testing components include optical components and electrical components related to optical modulation for generating one or more optical communication signals for transmission via one or more suitable optical media. In another embodiment, the one or more optical communication components separate from the plurality of optical testing components additionally or alternatively include optical components and electrical components related to optical demodulation of one or more optical communication signals received via one or more suitable optical media. In other embodiments, the one or more optical communication components separate from the plurality of optical testing components additionally or alternatively include optical components and optionally electrical components related to processing one or more optical signals in another suitable other than optical modulation or optical demodulation, such as filtering one or more optical signals, optically multiplexing optical signals, optically demultiplexing optical signals, etc.

In an embodiment, maneuvering the testing probe mechanism at block 1204 comprises maneuvering the testing probe mechanism 1100 of FIG. 11A. In another embodiment, maneuvering the testing probe mechanism at block 1204 comprises maneuvering the testing probe mechanism 1150 of FIG. 11B.

At block 1208, light from the testing probe mechanism is provided to the optical coupler of the first PIC chip. For example, light from the testing probe mechanism is provided to an optical coupler 160 (FIGS. 1A, 1C), in an embodiment. Light from the testing probe mechanism is provided to an optical coupler 640 (FIG. 6), in another embodiment. Light from the testing probe mechanism is provided to an optical coupler 756 (FIG. 7), in another embodiment.

At block 1212, light from the testing probe mechanism is transferred from the optical coupler to optical components disposed on the second PIC chip via the optical testing components of the first PIC chip. For example, light received via the optical coupler 160 is transferred to the second PIC chip via a waveguide 168 and an edge coupler 172 (FIG. 1A), in an embodiment. Light received via the optical coupler 640 is transferred to the second PIC chip via a waveguide 648 and an edge coupler 644 (FIG. 6), in another embodiment. Light received via the optical coupler 756 is transferred to the second PIC chip via a waveguide 778 and an edge coupler 776 (FIG. 7), in another embodiment.

In an embodiment, providing light from the testing probe mechanism to the optical coupler of the first PIC chip at block 1208 comprises providing light from the testing probe mechanism to a grating coupler of the first PIC chip; and transferring light from the optical coupler at block 1212 comprises transferring light from the grating coupler to the optical components disposed on the second PIC chip via the optical testing components of the first PIC chip.

In another embodiment, transferring light at block 1212 comprises: transferring light from the optical coupler of the first PIC chip to a first edge coupler of the first PIC chip; and transferring light from the first edge coupler of the first PIC chip to a second edge coupler of the second PIC chip. In an embodiment, the first edge coupler of the first PIC chip is optically aligned with second edge coupler of the second PIC chip while the first PIC chip and the second PIC are integral with the PIC wafer.

At block 1216, the light transferred from the testing probe mechanism to the optical components disposed on the second PIC at block 1212 is used to test one or more operational attributes of the optical components disposed on the second PIC chip.

In an embodiment, using the light provided from the testing probe mechanism to test one or more operational attributes of the optical components disposed on the second PIC chip at block 1216 comprises: using light provided from the testing probe mechanism and transferred from the first edge coupler of the first PIC chip to the second edge coupler of the second PIC chip to test at least an operational attribute of the second edge coupler of the second PIC chip.

At block 1220, light from the second PIC chip is transferred to the first PIC chip. For example, light output by edge couplers 136 of the PIC chip 104-2 is received by edge couplers 164 of the PIC chip 104-1 (FIG. 1A), in an embodiment. Light output by the edge couplers 620 of the PIC chip 604-2 is received by edge couplers 660 of the PIC chip 604-1 (FIG. 6), in another embodiment. Light output by the edge couplers 720 of the PIC chip 704-2 is received by edge couplers 784 of the PIC chip 704-1 (FIG. 7), in another embodiment.

At block 1224, the light transferred from the second PIC chip to the first PIC chip at block 1220 is used to test one or more other operational attributes of the optical components disposed on the second PIC chip.

In an embodiment, using the light transferred from the second PIC chip to the first PIC chip to test one or more other operational attributes of the optical components disposed on the second PIC chip at block 1224 comprises: using light output by a first edge coupler of the second PIC chip and received by a second edge coupler of the first PIC chip to test at least an operational attribute of the first edge coupler of the second PIC chip, the first edge coupler of the second PIC chip being optically aligned with the second edge coupler of the first PIC chip while the first PIC chip and the second PIC are integral with the PIC wafer.

In another embodiment, the method 1200 further comprises: transferring light from a first edge coupler of the second PIC chip to a second edge coupler of the first PIC chip, the first edge coupler of the second PIC chip being optically aligned with the second edge coupler of the first PIC chip while the first PIC chip and the second PIC are integral with the PIC wafer; transferring light from the second edge coupler of the first PIC chip to a third edge coupler of the first PIC chip; and transferring light from the third edge coupler of the first PIC chip to a fourth edge coupler of the second PIC chip, the third edge coupler of the first PIC chip being optically aligned with fourth edge coupler of the second PIC chip while the first PIC chip and the second PIC are integral with the PIC wafer. In another embodiment, using the light provided from the testing probe mechanism at block 1212 comprises: using light transferred from the third edge coupler of the first PIC chip to the fourth edge coupler of the second PIC chip to test at least an operational attribute of the fourth edge coupler of the second PIC chip.

In some embodiments, blocks 1220 and 1224 are omitted.

FIG. 13 is a flow diagram of an example method 1300 for manufacturing PIC chips, according to an embodiment. The method 1300 corresponds to manufacturing the PIC chips 104 of FIGS. 1A-C, the PIC chips 604 of FIG. 6, and/or the PIC chips 704 of FIG. 7, according to various embodiments, and the method 1300 is described with reference to FIGS. 1A, 6, and 7 for case of explanation. The method 1300 involves manufacturing other suitable PIC chips different than the PIC chips 104 of FIGS. 1A-C, the PIC chips 604 of FIG. 6, and the PIC chips 704 of FIG. 7, according to other embodiments. The PIC chips 104 of FIGS. 1A-C, the PIC chips 604 of FIG. 6, and/or the PIC chips 704 of FIG. 7 are manufactured according to another suitable method different than the method 1300, according to some embodiments.

The method 1300 includes blocks 1304 and 1308 as elements of fabricating a plurality of PIC chips on a PIC wafer having a substrate. At block 1304, for each PIC chip among multiple PIC chips of the PIC wafer, one or more optical components and one or more electrical components are fabricated on the substrate, the one or more optical components and one or more electrical components corresponding to at least one of i) an optical communication transmitter, and ii) an optical communication receiver.

Fabricating the one or more optical components and the and one or more electrical components comprises fabricating components associated with at least one of i) an optical modulator, and ii) an optical demodulator, according to some embodiments.

At block 1308, for each PIC chip among multiple PIC chips of the PIC wafer, testing components are fabricated on the substrate, the testing components being distinct from the one or more optical components and the one or more electrical components fabricated at block 1304. The testing components fabricated at block 1309 are configured to, while the PIC chip and another PIC chip adjacent to the PIC chip are integral with the PIC wafer, transfer light to the other PIC chip for testing one or more operational attributes of optical components disposed on the other PIC chip.

In an embodiment, fabricating the testing components at block 1308 comprises: fabricating a first edge coupler on the substrate to be optically aligned with a second edge coupler of the other PIC chip, the first edge coupler configured to, prior to the PIC chip being separated from the other PIC chip, transfer light to the second edge coupler of the other PIC chip for testing at least a first operational attribute among the one or more operational attributes of the optical components disposed on the other PIC chip.

In another embodiment, fabricating the testing components at block 1308 comprises: fabricating an optical coupler on the substrate, the optical coupler being configured to receive light from an optical testing probe; and fabricating a waveguide on the substrate that is optically coupled to the optical coupler and the first edge coupler, the waveguide being configured to transfer light between the optical coupler and the first edge coupler.

In another embodiment, fabricating the testing components at block 1308 comprises: fabricating a third edge coupler on the substrate to be optically aligned with a fourth edge coupler of the other PIC chip, the third edge coupler configured to, prior to the first PIC chip being separated from the second PIC chip, receive light from the fourth edge coupler of the second PIC chip for testing at least a second operational attribute among the one or more operational attributes of the optical components disposed on the second PIC chip.

In another embodiment, fabricating the testing components at block 1308 comprises: fabricating an optical coupler on the substrate, the optical coupler being configured to transfer light to an optical testing probe; and fabricating a waveguide on the substrate, the waveguide optically coupled to the optical coupler and the third edge coupler, the waveguide being configured to transfer light between the third edge coupler and the optical coupler.

In another embodiment, fabricating the testing components at block 1308 comprises: fabricating a photodiode fabricated on the substrate; and fabricating a waveguide on the substrate, the waveguide optically coupled to the photodiode and the third edge coupler, the waveguide being configured to transfer light between the third edge coupler and the photodiode; wherein the photodiode is configured to, prior to the first PIC chip being separated from the second PIC chip, generate an electrical signal based on light from the fourth edge coupler of the second PIC chip, the electrical signal associated with the second operational attribute of the optical components disposed on the second PIC chip.

At block 1312, for each PIC chip among multiple PIC chips of the PIC wafer, the testing components fabricated at block 1308 are used to test one or more operational attributes of optical components disposed on the other PIC chip that is adjacent to the PIC chip. In an embodiment, block 1312 includes performing the method 1200 of FIG. 12 to test the one or more operational attributes of optical components disposed on the other PIC chip. In other embodiments, another suitable method different than the method 1200 is performed to test the one or more operational attributes of optical components disposed on the other PIC chip.

At block 1316, at least some of the PIC chips of the PIC wafer are separated. In an embodiment, separating PIC chips at block 1316 includes separating PIC chips using laser dicing. In another embodiment, separating PIC chips at block 1316 includes separating PIC chips using blade dicing.

At block 1320, PIC chips separated at block 1316 are packaged in respective PIC packages.

In some embodiments, one or more of blocks 1312, 1316, and 1320 are omitted. For example, the end product of the method 1300 is an untested PIC wafer of unseparated PIC chips such as described above, in an embodiment. In another embodiment, the end product of the method 1300 is a tested PIC wafer of unseparated PIC chips such as described above. In another embodiment, the end product of the method 1300 is separated but unpackaged PIC chips.

Embodiment 1: A first photonics integrated circuit (PIC) chip, the first PIC chip having originated from a PIC wafer, the first PIC chip comprising: a substrate; one or more optical communication components fabricated on the substrate; and optical testing components fabricated on the substrate, the optical testing components configured to, prior to die singulation of the PIC wafer, transfer light to a second PIC chip on the PIC wafer for testing one or more operational attributes of optical components disposed on the second PIC chip, wherein the second PIC chip was adjacent to the first PIC chip on the PIC wafer prior to die singulation of the PIC wafer.

Embodiment 2: The first PIC chip of embodiment 1, wherein the optical testing components comprise: a first edge coupler fabricated on the substrate, the first edge coupler configured to, prior to die singulation of the PIC wafer, transfer light to a second edge coupler of the second PIC chip for testing at least a first operational attribute among the one or more operational attributes of the optical components disposed on the second PIC chip.

Embodiment 3: The first PIC chip of embodiment 2, wherein the optical testing components further comprise: an optical coupler fabricated on the substrate, the optical coupler being configured to receive light from an optical testing probe; and a waveguide fabricated on the substrate, the waveguide optically coupled to the optical coupler and the first edge coupler, the waveguide being configured to transfer light between the optical coupler and the first edge coupler.

Embodiment 4: The first PIC chip of embodiment 3, wherein: the optical coupler comprises a grating coupler.

Embodiment 5: The first PIC chip of any of embodiments 2-4, wherein the optical testing components further comprise: a third edge coupler fabricated on the substrate, the third edge coupler configured to, prior to die singulation of the PIC wafer, receive light from a fourth edge coupler of the second PIC chip for testing at least a second operational attribute among the one or more operational attributes of the optical components disposed on the second PIC chip.

Embodiment 6: The first PIC chip of embodiment 5, wherein the optical testing components further comprise: an optical coupler fabricated on the substrate, the optical coupler being configured to transfer light to an optical testing probe; and a waveguide fabricated on the substrate, the waveguide optically coupled to the optical coupler and the third edge coupler, the waveguide being configured to transfer light between the third edge coupler and the optical coupler.

Embodiment 7: The first PIC chip of embodiment 5, wherein the optical testing components further comprise: a photodiode fabricated on the substrate; and a waveguide fabricated on the substrate, the waveguide optically coupled to the photodiode and the third edge coupler, the waveguide being configured to transfer light between the third edge coupler and the photodiode; wherein the photodiode is configured to, prior to die singulation of the PIC wafer, generate an electrical signal based on light from the fourth edge coupler of the second PIC chip, the electrical signal associated with the second operational attribute of the optical components disposed on the second PIC chip.

Embodiment 8: The first PIC chip of any of embodiments 1-7, further comprising electrical testing components fabricated on the substrate, the electrical testing components including one or more electrical pads and being configured to, prior to die singulation of the PIC wafer: generate one or more electrical signals associated with at least a first operational attribute among the one or more operational attributes of the optical components disposed on the second PIC chip; and provide the one or more electrical signals to the one or more electrical pads for output to an electrical testing probe mechanism.

Embodiment 9: A method for manufacturing photonics integrated circuit (PIC) chips, the method comprising: fabricating a plurality of PIC chips on a PIC wafer having a substrate, including, for each PIC chip among multiple PIC chips of the PIC wafer: fabricating on the substrate one or more optical components and one or more electrical components corresponding to at least one of i) an optical communication transmitter, and ii) an optical communication receiver, and fabricating on the substrate testing components distinct from the one or more optical components and the one or more electrical components corresponding to the at least one of i) the optical communication transmitter, and ii) the optical communication receiver, the testing components configured to, while the PIC chip and another PIC chip adjacent to the PIC chip are integral with the PIC wafer, transfer light to the other PIC chip for testing one or more operational attributes of optical components disposed on the other PIC chip.

Embodiment 10: The method for manufacturing PIC chips of embodiment 9, wherein, for each PIC chip among multiple PIC chips of the PIC wafer, fabricating the testing components comprises: fabricating a first edge coupler on the substrate to be optically aligned with a second edge coupler of the other PIC chip, the first edge coupler configured to, prior to die singulation of the PIC wafer, transfer light to the second edge coupler of the other PIC chip for testing at least a first operational attribute among the one or more operational attributes of the optical components disposed on the other PIC chip.

Embodiment 11: The method for manufacturing PIC chips of embodiment 10, wherein, for each PIC chip among multiple PIC chips of the PIC wafer, fabricating the testing components further comprises: fabricating an optical coupler on the substrate, the optical coupler being configured to receive light from an optical testing probe; and fabricating a waveguide on the substrate that is optically coupled to the optical coupler and the first edge coupler, the waveguide being configured to transfer light between the optical coupler and the first edge coupler.

Embodiment 12: The method for manufacturing PIC chips of embodiment 10, wherein, for each PIC chip among multiple PIC chips of the PIC wafer, fabricating the testing components further comprises: fabricating a third edge coupler on the substrate to be optically aligned with a fourth edge coupler of the other PIC chip, the third edge coupler configured to, prior to die singulation of the PIC wafer, receive light from the fourth edge coupler of the second PIC chip for testing at least a second operational attribute among the one or more operational attributes of the optical components disposed on the second PIC chip.

Embodiment 13: The method for manufacturing PIC chips of embodiment 12, wherein, for each PIC chip among multiple PIC chips of the PIC wafer, fabricating the testing components further comprises: fabricating an optical coupler on the substrate, the optical coupler being configured to transfer light to an optical testing probe; and fabricating a waveguide on the substrate, the waveguide optically coupled to the optical coupler and the third edge coupler, the waveguide being configured to transfer light between the third edge coupler and the optical coupler.

Embodiment 14: The method for manufacturing PIC chips of embodiment 12, wherein, for each PIC chip among multiple PIC chips of the PIC wafer, fabricating the testing components further comprises: fabricating a photodiode fabricated on the substrate; and fabricating a waveguide on the substrate, the waveguide optically coupled to the photodiode and the third edge coupler, the waveguide being configured to transfer light between the third edge coupler and the photodiode; wherein the photodiode is configured to, prior to die singulation of the PIC wafer, generate an electrical signal based on light from the fourth edge coupler of the second PIC chip, the electrical signal associated with the second operational attribute of the optical components disposed on the second PIC chip.

Embodiment 15: The method for manufacturing PIC chips of any of embodiments 9-14, further comprising, for each PIC chip among the multiple PIC chips of the PIC wafer: fabricating at least a first optical coupler on the substrate, the at least the first optical coupler among the testing components of the PIC chip; fabricating one or more waveguides on the substrate, the one or more waveguides configured to transfer light between the optical coupler of the PIC chip and the other PIC chip; maneuvering a testing probe apparatus over the PIC wafer proximate to the at least the first optical coupler of the PIC chip; providing light from the testing probe apparatus to the at least the first optical coupler of the PIC chip; transferring light of the testing probe apparatus from the at least the first optical coupler to optical components disposed on the other PIC chip via the one or more waveguides of the PIC chip; and using the light transferred from the testing probe apparatus to the optical components disposed on the other PIC to test one or more operational attributes of the optical components disposed on the other PIC chip.

Embodiment 16: The method for manufacturing PIC chips of embodiment 15, wherein: fabricating at least the first optical coupler on the substrate comprises fabricating a grating coupler on the substrate; providing light from the testing probe apparatus to the at least the first optical coupler of the PIC chip comprises providing light from the testing probe apparatus to the grating coupler of the PIC chip; and transferring light from the at least the first optical coupler comprises transferring light from the grating coupler to the optical components disposed on the other PIC chip via the one or more waveguides of the first PIC chip.

Embodiment 17: The method for manufacturing PIC chips of either of embodiments 15 or 16, further comprising, for each PIC chip among the multiple PIC chips of the PIC wafer: fabricating a first edge coupler on the substrate, the first edge coupler being optically aligned with a second edge coupler of the other PIC chip; wherein transferring light to optical components disposed on the other PIC chip via the optical testing components of the first PIC chip comprises: transferring light from the at least the first optical coupler of the PIC chip to the first edge coupler of the PIC chip via the one or more waveguides, and transferring light from the first edge coupler of the PIC chip to the second edge coupler of the other PIC chip.

Embodiment 18: The method for manufacturing PIC chips of embodiment 17, wherein using the light provided from the testing probe apparatus to test one or more operational attributes of the optical components disposed on the other PIC chip comprises: using light provided from the testing probe apparatus and transferred from the first edge coupler of the PIC chip to the second edge coupler of the other PIC chip to test at least an operational attribute of the second edge coupler of the other PIC chip.

Embodiment 19: The method for manufacturing PIC chips of embodiment 17, further comprising, for each PIC chip among the multiple PIC chips of the PIC wafer: fabricating a third edge coupler on the substrate, the third edge coupler being optically aligned with a fourth edge coupler of the other PIC chip; fabricating a fifth edge coupler on the substrate, the fifth edge coupler being optically aligned with a sixth edge coupler of the other PIC chip; transferring light from the fourth edge coupler of the other PIC chip to the third edge coupler of the PIC chip; transferring light from the third edge coupler of the PIC chip to the fifth edge coupler of the PIC chip; and transferring light from the fifth edge coupler of the PIC chip to the sixth edge coupler of the other PIC chip.

Embodiment 20: The method for manufacturing PIC chips of embodiment 19, wherein using the light provided from the testing probe apparatus to test one or more operational attributes of the optical components disposed on the other PIC chip comprises: using light transferred from the fifth edge coupler of the PIC chip to the sixth edge coupler of the other PIC chip to test at least an operational attribute of the sixth edge coupler of the other PIC chip.

Embodiment 21: The method for manufacturing PIC chips of embodiment 17, further comprising, for each PIC chip among the multiple PIC chips of the PIC wafer: fabricating a third edge coupler on the substrate, the third edge coupler being optically aligned with a fourth edge coupler of the other PIC chip; fabricating a second optical coupler on the substrate; transferring light from the fourth edge coupler of the other PIC chip to the third edge coupler of the PIC chip; transferring light from the third edge coupler of the first PIC chip to the second optical coupler of the PIC chip; and receiving, at the testing probe apparatus, light from the other PIC chip that is output by the second optical coupler of the PIC chip.

Embodiment 22: The method for manufacturing PIC chips of embodiment 21, further comprising: using light from the second optical coupler of the PIC chip that is received by the testing probe apparatus to test at least an operational attribute of an optical component of the other PIC chip.

Embodiment 23: The method for manufacturing PIC chips of embodiment 22, wherein using light from the second optical coupler of the PIC chip that is received by the testing probe apparatus to test at least the operational attribute of the optical component of the other PIC chip comprises: using light from the second optical coupler of the PIC chip that is received by the testing probe apparatus to test at least an operational attribute of the fourth edge coupler of the other PIC chip.

Embodiment 24: The method for manufacturing PIC chips of any of embodiments 15-23, further comprising: performing die singulation for the PIC wafer to separate at least some of the PIC chips of the PIC wafer.

Embodiment 25: The method for manufacturing PIC chips of embodiment 24, further comprising: packaging PIC chips separated from the PIC wafer in respective PIC packages.

Embodiment 26: A method for testing photonics integrated circuit (PIC) chips integral with a PIC wafer, the method comprising: maneuvering a testing probe apparatus over the PIC wafer proximate to at least a first optical coupler among a plurality of optical testing components of a first PIC chip of the PIC wafer, the first PIC chip also comprising one or more optical communication components separate from the plurality of optical testing components; providing light from the testing probe apparatus to the at least the first optical coupler of the first PIC chip; transferring light of the testing probe apparatus from the at least the first optical coupler to optical components disposed on the second PIC chip via the optical testing components of the first PIC chip; and using the light transferred from the testing probe apparatus to the optical components disposed on the second PIC to test one or more operational attributes of the optical components disposed on the second PIC chip.

Embodiment 27: The method for testing PIC chips of embodiment 26, wherein: providing light from the testing probe apparatus to the at least the first optical coupler of the first PIC chip comprises providing light from the testing probe apparatus to a grating coupler of the first PIC chip; and transferring light from the at least the first optical coupler comprises transferring light from the grating coupler to the optical components disposed on the second PIC chip via the optical testing components of the first PIC chip.

Embodiment 28: The method for testing PIC chips of embodiment 26, wherein transferring light to optical components disposed on the second PIC chip via the optical testing components of the first PIC chip comprises: transferring light from the at least the first optical coupler of the first PIC chip to a first edge coupler of the first PIC chip; and transferring light from the first edge coupler of the first PIC chip to a second edge coupler of the second PIC chip, the first edge coupler of the first PIC chip being optically aligned with second edge coupler of the second PIC chip while the first PIC chip and the second PIC are integral with the PIC wafer.

Embodiment 29: The method for testing PIC chips of embodiment 28, wherein using the light provided from the testing probe apparatus to test one or more operational attributes of the optical components disposed on the second PIC chip comprises: using light provided from the testing probe apparatus and transferred from the first edge coupler of the first PIC chip to the second edge coupler of the second PIC chip to test at least an operational attribute of the second edge coupler of the second PIC chip.

Embodiment 30: The method for testing PIC chips of embodiment 28, wherein transferring light to optical components disposed on the second PIC chip via the optical testing components of the first PIC chip comprises: transferring light from a third edge coupler of the second PIC chip to a fourth edge coupler of the first PIC chip, the third edge coupler of the second PIC chip being optically aligned with fourth edge coupler of the first PIC chip while the first PIC chip and the second PIC are integral with the PIC wafer; transferring light from the fourth edge coupler of the first PIC chip to a fifth edge coupler of the first PIC chip; and transferring light from the fifth edge coupler of the first PIC chip to a sixth edge coupler of the second PIC chip, the fifth edge coupler of the first PIC chip being optically aligned with sixth edge coupler of the second PIC chip while the first PIC chip and the second PIC are integral with the PIC wafer.

Embodiment 31: The method for testing PIC chips of embodiment 30, wherein using the light provided from the testing probe apparatus to test one or more operational attributes of the optical components disposed on the second PIC chip comprises: using light transferred from the fifth edge coupler of the first PIC chip to the sixth edge coupler of the second PIC chip to test at least an operational attribute of the sixth edge coupler of the second PIC chip.

Embodiment 32: The method for testing PIC chips of embodiment 28, further comprising: transferring light from a third edge coupler of the second PIC chip to a fourth edge coupler of the first PIC chip, the third edge coupler of the second PIC chip being optically aligned with fourth edge coupler of the first PIC chip while the first PIC chip and the second PIC are integral with the PIC wafer; transferring light from the fourth edge coupler of the first PIC chip to a second optical coupler of the first PIC chip of the PIC wafer; and receiving, at the testing probe apparatus, light from the second PIC chip that is output by the second optical coupler of the first PIC chip.

Embodiment 33: The method for testing PIC chips of embodiment 32, further comprising: using light from the second optical coupler of the first PIC chip that is received by the testing probe apparatus to test at least an operational attribute of an optical component of the second PIC chip.

Embodiment 34: The method for testing PIC chips of embodiment 33, wherein using light from the second optical coupler of the first PIC chip that is received by the testing probe apparatus to test at least the operational attribute of the optical component of the second PIC chip comprises: using light from the second optical coupler of the first PIC chip that is received by the testing probe apparatus to test at least an operational attribute of the third edge coupler of the second PIC chip.

Some of the various blocks, operations, and techniques described above may be implemented utilizing hardware, a processor executing firmware instructions, a processor executing software instructions, or any suitable combination thereof. When implemented utilizing a processor executing software or firmware instructions, the software or firmware instructions may be stored in any suitable computer readable memory. The software or firmware instructions may include machine readable instructions that, when executed by one or more processors, cause the one or more processors to perform various acts such as described above.

When implemented in hardware, the hardware may comprise one or more of discrete components, an integrated circuit, an application-specific integrated circuit (ASIC), a programmable logic device (PLD), etc.

While the present invention has been described with reference to specific examples, which are intended to be illustrative only and not to be limiting of the invention, changes, additions and/or deletions may be made to the disclosed embodiments without departing from the scope of the invention.

What is claimed is:

1. A first photonics integrated circuit (PIC) chip, the first PIC chip having originated from a PIC wafer, the first PIC chip comprising:

a substrate;

one or more optical communication components fabricated on the substrate, the one or more optical components including i) at least one optical modulator, and ii)

at least one first edge coupler configured to output modulated light from the at least one optical modulator, the at least one first edge coupler located at one or more edges of the first PIC chip; and optical testing components fabricated on the substrate, the optical testing components including:

a second edge coupler located at a first edge of the first PIC chip, the second edge coupler configured to, prior to die singulation of the PIC wafer, transfer light to a second PIC chip on the PIC wafer for testing at least a first operational attribute among operational attributes of optical components disposed on the second PIC chip, wherein the second PIC chip was adjacent to the first PIC chip on the PIC wafer prior to die singulation of the PIC wafer.

2. The first PIC chip of claim 1, wherein the second edge coupler is configured to, prior to die singulation of the PIC wafer, transfer light to a second edge coupler of the second PIC chip.

3. The first PIC chip of claim 1, wherein the optical testing components further comprise:

an optical coupler fabricated on the substrate, the optical coupler being configured to receive light from an optical testing probe; and a waveguide fabricated on the substrate, the waveguide optically coupled to the optical coupler and the second edge coupler, the waveguide being configured to transfer light between the optical coupler and the second edge coupler.

4. The first PIC chip of claim 3, wherein:

the optical coupler comprises a grating coupler.

5. The first PIC chip of claim 1, wherein the optical testing components further comprise:

a third edge coupler fabricated on the substrate, the third edge coupler configured to, prior to die singulation of the PIC wafer, receive light from a fourth edge coupler of the second PIC chip for testing at least a second operational attribute among the one or more operational attributes of the optical components disposed on the second PIC chip.

6. The first PIC chip of claim 5, wherein the optical testing components further comprise:

an optical coupler fabricated on the substrate, the optical coupler being configured to transfer light to an optical testing probe; and a waveguide fabricated on the substrate, the waveguide optically coupled to the optical coupler and the third edge coupler, the waveguide being configured to transfer light between the third edge coupler and the optical coupler.

7. The first PIC chip of claim 5, wherein the optical testing components further comprise:

a photodiode fabricated on the substrate; and a waveguide fabricated on the substrate, the waveguide optically coupled to the photodiode and the third edge coupler, the waveguide being configured to transfer light between the third edge coupler and the photodiode;

wherein the photodiode is configured to, prior to die singulation of the PIC wafer, generate an electrical signal based on light from the fourth edge coupler of the second PIC chip, the electrical signal associated with the second operational attribute of the optical components disposed on the second PIC chip.

8. The first PIC chip of claim 1, further comprising electrical testing components fabricated on the substrate, the electrical testing components including one or more electrical pads and being configured to, prior to die singulation of the PIC wafer:

generate one or more electrical signals associated with at least a second operational attribute among the one or more operational attributes of the optical components disposed on the second PIC chip; and provide the one or more electrical signals to the one or more electrical pads for output to an electrical testing probe mechanism.

9. A method for manufacturing photonics integrated circuit (PIC) chips, the method comprising:

fabricating a plurality of PIC chips on a PIC wafer having a substrate, including, for each PIC chip among multiple PIC chips of the PIC wafer:

fabricating on the substrate one or more optical components and one or more electrical components corresponding to at least one of i) an optical communication transmitter, and ii) an optical communication receiver, the one or more optical components including i) at least one optical modulator, and ii) at least one first edge coupler configured to output modulated light from the at least one optical modulator, the at least one first edge coupler located at one or more edges of the first PIC chip, and fabricating on the substrate testing components distinct from the one or more optical components and the one or more electrical components corresponding to the at least one of i) the optical communication transmitter, and ii) the optical communication receiver, the testing components configured to, while the PIC chip and another PIC chip adjacent to the PIC chip are integral with the PIC wafer, transfer light to the other PIC chip for testing one or more operational attributes of optical components disposed on the other PIC chip, the fabricating of the testing components including:

fabricating a second edge coupler on the substrate located at a first edge of the first PIC chip, the second edge coupler configured to, prior to die singulation of the PIC wafer, transfer light to the other PIC chip for testing at least a first operational attribute among the one or more operational attributes of the optical components disposed on the other PIC chip.

10. The method for manufacturing PIC chips of claim 9, wherein, for each PIC chip among multiple PIC chips of the PIC wafer, fabricating the testing components comprises:

fabricating the second edge coupler on the substrate to be optically aligned with a third edge coupler of the other PIC chip.

11. The method for manufacturing PIC chips of claim 9, wherein, for each PIC chip among multiple PIC chips of the PIC wafer, fabricating the testing components further comprises:

fabricating an optical coupler on the substrate, the optical coupler being configured to receive light from an optical testing probe; and fabricating a waveguide on the substrate that is optically coupled to the optical coupler and the second edge coupler, the waveguide being configured to transfer light between the optical coupler and the second edge coupler.

12. The method for manufacturing PIC chips of claim 9, wherein, for each PIC chip among multiple PIC chips of the PIC wafer, fabricating the testing components further comprises:

fabricating a third edge coupler on the substrate to be optically aligned with a fourth edge coupler of the other PIC chip, the third edge coupler configured to, prior to die singulation of the PIC wafer, receive light from the fourth edge coupler of the second PIC chip for testing at least a second operational attribute among the one or more operational attributes of the optical components disposed on the second PIC chip.

13. The method for manufacturing PIC chips of claim 12, wherein, for each PIC chip among multiple PIC chips of the PIC wafer, fabricating the testing components further comprises:

fabricating an optical coupler on the substrate, the optical coupler being configured to transfer light to an optical testing probe; and fabricating a waveguide on the substrate, the waveguide optically coupled to the optical coupler and the third edge coupler, the waveguide being configured to transfer light between the third edge coupler and the optical coupler.

14. The method for manufacturing PIC chips of claim 12, wherein, for each PIC chip among multiple PIC chips of the PIC wafer, fabricating the testing components further comprises:

fabricating a photodiode fabricated on the substrate; and fabricating a waveguide on the substrate, the waveguide optically coupled to the photodiode and the third edge coupler, the waveguide being configured to transfer light between the third edge coupler and the photodiode;

wherein the photodiode is configured to, prior to die singulation of the PIC wafer, generate an electrical signal based on light from the fourth edge coupler of the second PIC chip, the electrical signal associated with the second operational attribute of the optical components disposed on the second PIC chip.

15. The method for manufacturing PIC chips of claim 9, further comprising, for each PIC chip among the multiple PIC chips of the PIC wafer:

fabricating at least a first optical coupler on the substrate, the at least the first optical coupler among the testing components of the PIC chip;

fabricating one or more waveguides on the substrate, the one or more waveguides configured to transfer light between the first optical coupler of the PIC chip and the second edge coupler;

maneuvering a testing probe apparatus over the PIC wafer proximate to the at least the first optical coupler of the PIC chip;

providing light from the testing probe apparatus to the at least the first optical coupler of the PIC chip;

transferring light of the testing probe apparatus from the at least the first optical coupler to optical components disposed on the other PIC chip via the one or more waveguides of the PIC chip and via the second edge coupler; and using the light transferred from the testing probe apparatus to the optical components disposed on the other PIC to test one or more operational attributes of the optical components disposed on the other PIC chip.

16. The method for manufacturing PIC chips of claim 15, wherein:

fabricating at least the first optical coupler on the substrate comprises fabricating a grating coupler on the substrate;

providing light from the testing probe apparatus to the at least the first optical coupler of the PIC chip comprises providing light from the testing probe apparatus to the grating coupler of the PIC chip; and transferring light from the at least the first optical coupler comprises transferring light from the grating coupler to the optical components disposed on the other PIC chip via the one or more waveguides of the first PIC chip and the second edge coupler.

17. The method for manufacturing PIC chips of claim 15, further comprising, for each PIC chip among the multiple PIC chips of the PIC wafer:

fabricating the second edge coupler to be optically aligned with a third edge coupler of the other PIC chip;

wherein transferring light to optical components disposed on the other PIC chip via the optical testing components of the first PIC chip comprises:

transferring light from the at least the first optical coupler of the PIC chip to the second edge coupler of the PIC chip via the one or more waveguides, and transferring light from the second edge coupler of the PIC chip to the third edge coupler of the other PIC chip.

18. The method for manufacturing PIC chips of claim 17, wherein using the light provided from the testing probe apparatus to test one or more operational attributes of the optical components disposed on the other PIC chip comprises:

using light provided from the testing probe apparatus and transferred from the second edge coupler of the PIC chip to the third edge coupler of the other PIC chip to test at least an operational attribute of the third edge coupler of the other PIC chip.

19. The method for manufacturing PIC chips of claim 17, further comprising, for each PIC chip among the multiple PIC chips of the PIC wafer:

fabricating a fourth edge coupler on the substrate, the third fourth edge coupler being optically aligned with a fifth edge coupler of the other PIC chip;

fabricating a sixth edge coupler on the substrate, the fifth sixth edge coupler being optically aligned with a seventh edge coupler of the other PIC chip;

transferring light from the fifth edge coupler of the other PIC chip to the fourth edge coupler of the PIC chip;

transferring light from the fourth edge coupler of the PIC chip to the sixth edge coupler of the PIC chip; and transferring light from the sixth edge coupler of the PIC chip to the seventh edge coupler of the other PIC chip.

20. The method for manufacturing PIC chips of claim 19, wherein using the light provided from the testing probe apparatus to test one or more operational attributes of the optical components disposed on the other PIC chip comprises:

using light transferred from the sixth edge coupler of the PIC chip to the seventh edge coupler of the other PIC chip to test at least an operational attribute of the seventh edge coupler of the other PIC chip.

21. The method for manufacturing PIC chips of claim 17, further comprising, for each PIC chip among the multiple PIC chips of the PIC wafer:

fabricating a fourth edge coupler on the substrate, the fourth edge coupler being optically aligned with a fifth edge coupler of the other PIC chip;

fabricating a second optical coupler on the substrate;

transferring light from the fifth edge coupler of the other PIC chip to the fourth edge coupler of the PIC chip;

transferring light from the fourth edge coupler of the first PIC chip to the second optical coupler of the PIC chip; and receiving, at the testing probe apparatus, light from the other PIC chip that is output by the second optical coupler of the PIC chip.

22. The method for manufacturing PIC chips of claim 21, further comprising:

using light from the second optical coupler of the PIC chip that is received by the testing probe apparatus to test at least an operational attribute of an optical component of the other PIC chip.

23. The method for manufacturing PIC chips of claim 22, wherein using light from the second optical coupler of the PIC chip that is received by the testing probe apparatus to test at least the operational attribute of the optical component of the other PIC chip comprises:

using light from the second optical coupler of the PIC chip that is received by the testing probe apparatus to test at least an operational attribute of the fifth edge coupler of the other PIC chip.

24. The method for manufacturing PIC chips of claim 15, further comprising:

performing die singulation for the PIC wafer to separate at least some of the PIC chips of the PIC wafer.

25. The method for manufacturing PIC chips of claim 24, further comprising:

packaging PIC chips separated from the PIC wafer in respective PIC packages.

* * * * *